(12) United States Patent
    Kaseya

(10) Patent No.: US 11,081,519 B2
(45) Date of Patent: Aug. 3, 2021

(54) LIGHT EMITTING DEVICE, PROJECTOR, AND METHOD OF MANUFACTURING LIGHT EMITTING DEVICE

(71) Applicant: Seiko Epson Corporation, Tokyo (JP)

(72) Inventor: Hiroyasu Kaseya, Fujimi (JP)

(73) Assignee: Seiko Epson Corporation

( * ) Notice: Subject to any disclaimer, the term of this patent is extended or adjusted under 35 U.S.C. 154(b) by 67 days.

(21) Appl. No.: 16/228,871

(22) Filed: Dec. 21, 2018

(65) Prior Publication Data

US 2019/0198560 A1    Jun. 27, 2019

(30) Foreign Application Priority Data

Dec. 26, 2017   (JP) .............................. JP2017-248943

(51) Int. Cl.
    *H01L 33/00*      (2010.01)
    *H01L 27/15*      (2006.01)
    (Continued)

(52) U.S. Cl.
    CPC .......... *H01L 27/15* (2013.01); *G03B 21/2033* (2013.01); *H01L 25/0753* (2013.01); *H01L 33/007* (2013.01); *H01L 33/08* (2013.01); *H01L 33/44* (2013.01); *H01L 33/62* (2013.01); *H01L 33/20* (2013.01); *H01L 33/24* (2013.01);
    (Continued)

(58) Field of Classification Search
    CPC ................. H01L 27/0753; H01L 27/15; H01L 2933/0066; H01L 33/44; H01L 33/62; H01L 33/007; H01L 33/08
    See application file for complete search history.

(56) References Cited

U.S. PATENT DOCUMENTS

2007/0170444 A1    7/2007   Cao
2011/0062453 A1    3/2011   Armitage
                   (Continued)

FOREIGN PATENT DOCUMENTS

JP     2003-158296 A    5/2003
JP     2009-009978 A    1/2009
                (Continued)

OTHER PUBLICATIONS

Extended European Search Report for Patent Application No. EP18215349.4 dated May 10, 2019 (9 pages).

*Primary Examiner* — Samuel A Gebremariam
(74) *Attorney, Agent, or Firm* — Harness, Dickey & Pierce, P.L.C.

(57) ABSTRACT

A light emitting device includes a light emitting element including a first base member, and a stacked body provided to the first base member, and a second base member provided with the light emitting element, the stacked body includes a first columnar section having a first height, and a second columnar section having a second height smaller than the first height, the first columnar section and the second base member are electrically connected to each other via a first conductive member between the stacked body and the second base member, the second columnar section and the second base member are electrically connected to each other via a second conductive member between the stacked body and the second base member, the first conductive member has a third height, and the second conductive member has a fourth height larger than the third height.

6 Claims, 18 Drawing Sheets

(51) Int. Cl.
    *H01L 33/62*     (2010.01)
    *H01L 33/08*     (2010.01)
    *H01L 33/44*     (2010.01)
    *G03B 21/20*     (2006.01)
    *H01L 25/075*     (2006.01)
    *H01L 33/20*     (2010.01)
    *H01L 33/32*     (2010.01)
    *H01L 33/40*     (2010.01)
    *H01L 33/24*     (2010.01)

(52) U.S. Cl.
    CPC .............. *H01L 33/32* (2013.01); *H01L 33/40* (2013.01); *H01L 2933/0025* (2013.01); *H01L 2933/0066* (2013.01)

(56) References Cited

U.S. PATENT DOCUMENTS

| | | | |
|---|---|---|---|
| 2011/0134396 A1* | 6/2011 | Kaseya | H01L 33/0045 353/31 |
| 2011/0204327 A1 | 8/2011 | Hiruma et al. | |
| 2014/0246647 A1 | 9/2014 | Cha et al. | |
| 2015/0111329 A1* | 4/2015 | Wu | H01L 33/0095 438/28 |

FOREIGN PATENT DOCUMENTS

| | | |
|---|---|---|
| JP | 2009-283876 A | 12/2009 |
| JP | 5211352 B2 | 6/2013 |

\* cited by examiner

LIGHT EMITTING DEVICE, PROJECTOR, AND METHOD OF MANUFACTURING LIGHT EMITTING DEVICE

BACKGROUND

1. Technical Field

The present invention relates to a light emitting device, a projector, and a method of manufacturing a light emitting device.

2. Related Art

A light emitting element to which nanostructures (nano columns) are applied gathers attention as a light emitting element such as a semiconductor laser or a light emitting diode. In the light emitting element to which the nanostructures are applied, it is possible to reduce dislocations and defects occurring in a semiconductor layer constituting the light emitting element, and thus, it is possible to obtain a high quality crystal. Therefore, the light emitting element to which the nanostructures are applied can be provided with excellent light emitting characteristics.

As a mounting method of the light emitting element, there is known junction-down mounting. By mounting the light emitting element using the junction-down mounting, it is possible to efficiently radiate the heat generated in the light emitting element.

In JP-A-2009-9978 (Document 1), for example, there is disclosed a method of mounting the light emitting element having the nano columns in a ceramic package using flip chip mounting. Specifically, a p-type electrode layer (a transparent conductive film) is formed on the plurality of nano columns, and then the p-type electrode layer is bonded to a p-type interconnection provided to the ceramic package with an Au bump. In such a manner, in Document 1, the light emitting element having the nano columns is mounted in the ceramic package using the junction-down mounting.

Here, in the light emitting element to which the nanostructures are applied, it is possible to control the wavelength by changing the diametrical sizes and the pitch of the nanostructures. Therefore, it is possible to emit light beams different in wavelength from each other from the plurality of nanostructures formed on a single substrate, and thus, it is possible to realize the light emitting element performing multicolor emission with the single substrate.

However, in such a light emitting element, by changing the diametrical sizes and the pitch of the nanostructures formed on the same substrate, the nanostructures become different in height from each other in some cases. Therefore, in the case of mounting such a light emitting element on a mounting board using the junction-down mounting, the gap between the nanostructure low in height and the mounting board becomes larger than the gap between the nanostructure high in height and the mounting board. Thus, the possibility that a contact failure occurs between the nanostructure low in height and the mounting board becomes high.

SUMMARY

An advantage of some aspects of the invention is to provide a light emitting device capable of improving the connection stability between the light emitting element and the mounting board. Another advantage of some aspects of the invention is to provide a method of manufacturing the light emitting device capable of improving the connection stability between the light emitting element and the mounting board. Another advantage of some aspects of the invention is to provide a projector including the light emitting device described above.

A light emitting device according to an aspect of the invention includes a light emitting element including a first base member, and a stacked body provided to the first base member, and a second base member provided with the light emitting element, the stacked body includes a first semiconductor layer, a second semiconductor layer different in conductivity type from the first semiconductor layer, and a light emitting layer disposed between the first semiconductor layer and the second semiconductor layer, the light emitting layer being capable of emitting light in response to a current injected into the light emitting layer, the stacked body includes a first columnar section having a first height, and a second columnar section having a second height smaller than the first height, the first columnar section and the second base member are electrically connected to each other via a first conductive member between the stacked body and the second base member, the second columnar section and the second base member are electrically connected to each other via a second conductive member between the stacked body and the second base member, the first conductive member has a third height, and the second conductive member has a fourth height larger than the third height.

In such a light emitting device, since the height of the second conductive member is larger than the height of the first conductive member, it is possible to reduce the possibility that the contact failure occurs between the second columnar section and the second base member. Therefore, in such a light emitting device, it is possible to enhance the connection stability between the light emitting element and the second base member (a mounting board).

It should be noted that in the descriptions related to the invention, the term "electrically connected" is used in such a phrase as "a specific member (hereinafter referred to as a "member B") "electrically connected" to another specific member (hereinafter referred to as a "member A")." In the descriptions related to the invention, in such a case as this example, the term "electrically connected" is used assuming that the case in which the member A and the member B are electrically connected while having direct contact with each other, and the case in which the member A and the member B are electrically connected to each other via another member are included.

In the light emitting device according to the aspect of the invention, the first columnar section and the second columnar section may each include the first semiconductor layer, the second semiconductor layer, and the light emitting layer.

In such a light emitting device, it is possible to obtain the first semiconductor layer, the second semiconductor layer and the light emitting layer with crystal defects and dislocations reduced, and thus, it is possible to realize the light emitting device high in efficiency.

In the light emitting device according to the aspect of the invention, a first insulating layer may be disposed between the first base member and the second base member, the first conductive member may be disposed in a first opening section provided to the first insulating layer, and the second conductive member may be disposed in a second opening section provided to the first insulating layer.

In such a light emitting device, it is possible to reduce the possibility that the first conductive member and the second conductive member are electrically shorted to each other.

In the light emitting device according to the aspect of the invention, a second insulating layer may be disposed between the first columnar section and the second columnar section.

In such a light emitting device, due to the second insulating layer, it is possible to reduce the diffusion of the light generated in the light emitting layer of the first columnar section and the diffusion of the light generated in the light emitting layer of the second columnar section.

In the light emitting device according to the aspect of the invention, a wavelength of light emitted by the light emitting layer in the first columnar section and a wavelength of light emitted by the light emitting layer in the second columnar section may be different from each other.

In such a light emitting device, the multicolor emission can be achieved with a single substrate (the first base member).

A method of manufacturing a light emitting device according to another aspect of the invention includes forming a stacked body including a first columnar section having a first height and a second columnar section having a section height smaller than the first height on a first base member to form a light emitting element, forming a first conductive member having a third height on the first columnar section, and a second conductive member having a fourth height larger than the third height on the second columnar section, and mounting the light emitting element on a second base member, wherein the stacked body includes a first semiconductor layer, a second semiconductor layer different in conductivity type from the first semiconductor layer, and a light emitting layer disposed between the first semiconductor layer and the second semiconductor layer, the light emitting layer being capable of emitting light in response to a current injected into the light emitting layer, in the mounting the light emitting element on the second base member, the first columnar section and the second base member are electrically connected via the first conductive member between the stacked body and the second base member, and the second columnar section and the second base member are electrically connected to each other via the second conductive member between the stacked body and the second base member.

In such a method of manufacturing the light emitting device, since the height of the second conductive member is made larger than the height of the first conductive member, it is possible to reduce the possibility that the contact failure occurs between the second columnar section and the second base member. Therefore, in such a method of manufacturing the light emitting device, it is possible to manufacture the light emitting device high in the connection stability between the light emitting element and the second base member.

It should be noted that in the descriptions related to the invention, in the case of using the term "on" in such a phrase as "a specific object (hereinafter referred to as "D") is formed "on" another specific object (hereinafter referred to as "C")," the term "on" is used assuming that both of the case of forming D directly on C and the case of forming D indirectly on C via another object.

A projector according to another aspect of the invention includes the light emitting device according to the aspect of the invention.

In such a projector, it is possible to include the light emitting device according to the aspect of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some preferred embodiments of the invention will hereinafter be described in detail with reference to the accompanying drawings. It should be noted that the embodiments described below do not unreasonably limit the contents of the invention as set forth in the appended claims. Further, all of the constituents described hereinafter are not necessarily essential elements of the invention.

1. First Embodiment

1.1. Light Emitting Device

Figure 1:
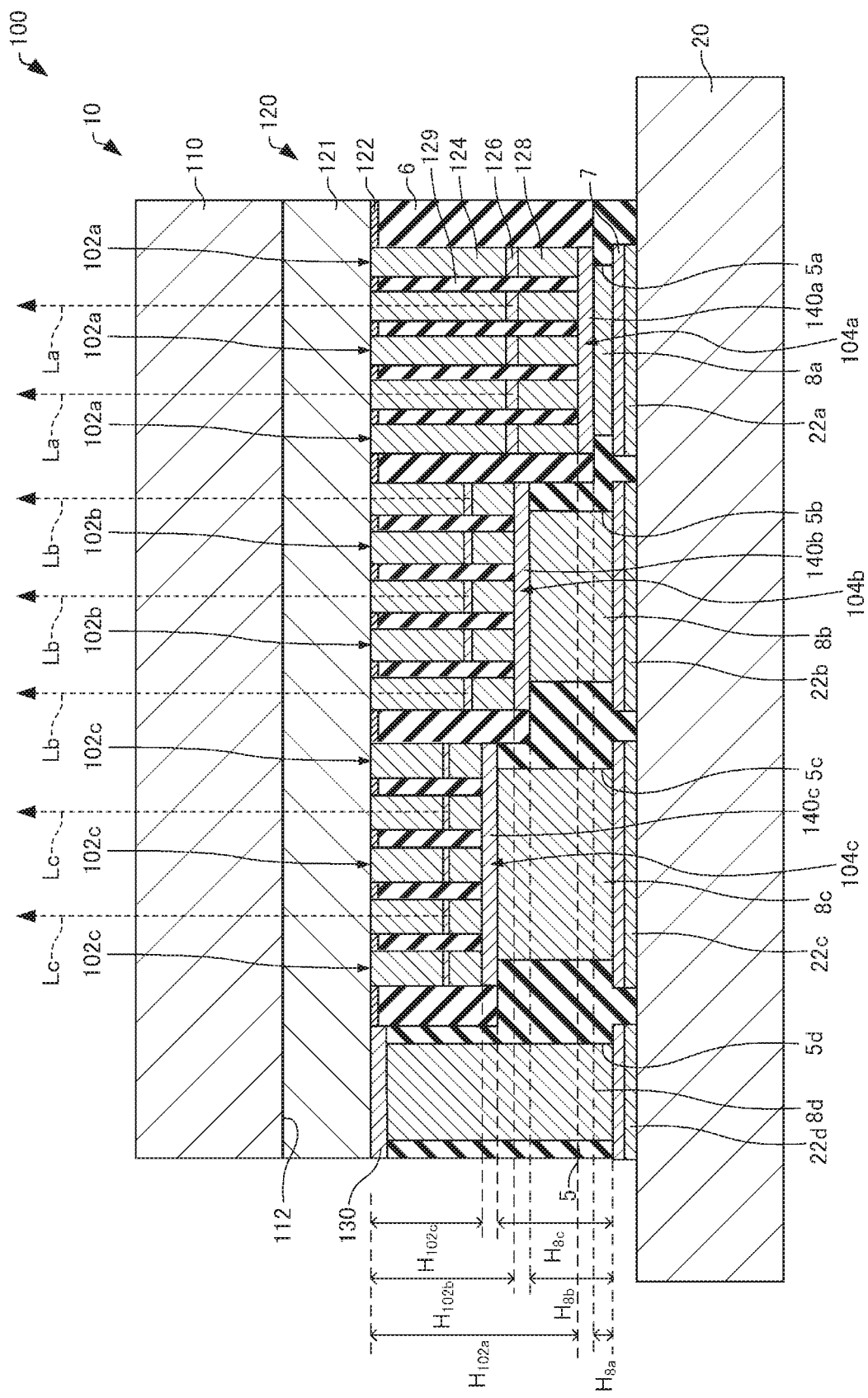
FIG. 1 is a cross-sectional view schematically showing a light emitting device according to a first embodiment of the invention.

Firstly, a light emitting device according to a first embodiment will be described with reference to the accompanying drawings. FIG. 1 is a cross-sectional view schematically showing the light emitting device 100 according to the first embodiment.

As shown in FIG. 1, the light emitting device 100 includes a light emitting element 10 and a second base member 20 provided with the light emitting element 10. In the light emitting device 100, the light emitting element 10 is mounted on the second base member 20 (a mounting board) using the junction-down mounting.

As shown in FIG. 1, the light emitting element 10 includes a first base member 110, a stacked body 120, a first electrode 130, and second electrodes 140a, 140b and 140c.

The first base member 110 has, for example, a plate-like shape. The first base member 110 is, for example, a sapphire substrate. The first base member 110 is transparent with respect to light beams La, Lb and Lc generated in light emitting layers 126. Therefore, the light beams La, Lb and Lc generated in light emitting layers 126 are transmitted through the first base member 110 to be emitted to the outside. In other words, the light emitting device 100 emits the light beams La, Lb and Lc from the first base member 110 side.

It should be noted that the first base member 110 is not limited to the sapphire substrate, but it is also possible to use other ceramics substrates, glass substrates or the like.

The stacked body 120 is provided to the first base member 110. The stacked body 120 is located between the first base member 110 and the second base member 20.

The stacked body 120 is constituted by a plurality of layers stacked on a principal surface 112 of the first base member 110. The stacked body 120 includes a buffer layer 121, a mask layer 122, a first semiconductor layer 124, a light emitting layer 126 and a second semiconductor layer 128. The stacking direction of the stacked body 120 (hereinafter simply referred to as a "stacking direction") is perpendicular to the principal surface 112 of the first base member 110.

The buffer layer 121 is provided to principal surface 112 of the first base member 110. The buffer layer 121 is disposed between the mask layer 122 and the first base member 110, and between the first semiconductor layer 124 and the first base member 110. The buffer layer 121 is, for example, a gallium nitride (GaN) layer of a first conductivity type (e.g., the n-type). It should be noted that in the present embodiment, the buffer layer 121 can also be provided with a two-layered structure having an undoped GaN layer and the first conductivity type (e.g., the n-type) GaN layer stacked in this order from the substrate side.

The mask layer 122 is provided to the buffer layer 121. The mask layer 122 is disposed between a second insulating layer 6 and the buffer layer 121, and between an insulating layer 129 and the buffer layer 121. The mask layer 122 is, for example, a titanium layer, a titanium oxide layer or a silicon oxide layer. The mask layer 122 is a layer functioning as a mask for selectively growing the first semiconductor layer 124, the light emitting layer 126 and the second semiconductor layer 128 on the buffer layer 121 to form columnar sections 102a, 102b and 102c.

The first semiconductor layer 124 is provided to the buffer layer 121. The first semiconductor layer 124 is disposed between the buffer layer 121 and the light emitting layer 126. The first semiconductor layer 124 is, for example, a GaN layer of a first conductivity type (e.g., the n-type). The first semiconductor layer 124 is, for example, an Si-doped n-type GaN layer.

The light emitting layer 126 is disposed between the first semiconductor layer 124 and the second semiconductor layers 128. The light emitting layer 126 includes, for example, indium gallium nitride (InGaN). The light emitting layer 126 has a quantum well structure constituted by, for example, at least one GaN layer and at least one InGaN layer. The number of the GaN layers and the number of the InGaN layers constituting the light emitting layer 126 are not particularly limited. The light emitting layer 126 is a layer capable of emitting light in response to injection of an electrical current.

The second semiconductor layer 128 is disposed between the light emitting layer 126 and the second electrodes 140a, 140b and 140c. The second semiconductor layer 128 is a layer different in conductivity type from the first semiconductor layer 124. The second semiconductor layer 128 is, for example, a GaN layer of a second conductivity type (e.g., the p-type). The second semiconductor layer 128 is, for example, an Mg-doped p-type GaN layer. The semiconductor layers 124, 128 are each a cladding layer having a function of increasing the light intensity in the vicinity of the light emitting layer 126 (preventing the light from being leaked from the light emitting layer 126). It should be noted that the second semiconductor layer 128 can also be provided with a contact layer having ohmic contact with the second electrodes 140a, 140b and 140c.

The stacked body 120 includes a plurality of first columnar sections 102a, a plurality of second columnar sections 102b and a plurality of third columnar sections 102c. The columnar sections 102a, 102b and 102c each include the first semiconductor layer 124, the light emitting layer 126 and the second semiconductor layer 128.

The plurality of first columnar sections 102a constitutes a first light emitting section 104a. The plurality of second columnar sections 102b constitutes a second light emitting section 104b. The plurality of third columnar sections 102c constitutes a third light emitting section 104c.

In the first light emitting section 104a, the p-type second semiconductor layer 128, the light emitting layer 126 with no impurity doped, and the n-type first semiconductor layer 124 constitute a pin diode. Each of the first semiconductor layer 124 and the second semiconductor layer 128 is a layer larger in bandgap than the light emitting layer 126. When applying a forward bias voltage of the pin diode (when injecting a current) between the first electrode 130 and the second electrode 140a, recombination of the electron and the hole occurs in the light emitting layer 126. The recombination causes emission of light. The light generated in the light emitting layer 126 propagates in a planar direction (a direction perpendicular to the stacking direction) due to the semiconductor layers 124, 128 to form a standing wave in the planar direction in the plurality of first columnar sections 102a to cause laser oscillation receiving a gain in the light emitting layer 126. Then, the first light emitting section 104a emits positive first-order diffracted light and negative first-order diffracted light as the light La (a laser beam) in the stacking direction. The light La is emitted while being transmitted through the first base member 110.

Substantially the same as the first light emitting section 104a also applies to the second light emitting section 104b and the third light emitting section 104c. Specifically, in the second light emitting section 104b, by applying a voltage between the first electrode 130 and the second electrode 140b, the light Lb is emitted through the first base member 110. Further, in the third light emitting section 104c, by applying a voltage between the first electrode 130 and the second electrode 140c, the light Lc is emitted through the first base member 110.

Although not shown in the drawings, two or more first light emitting sections 104a can also be disposed. Similarly, two or more second light emitting sections 104b can also be disposed. Similarly, two or more third light emitting sections 104c can also be disposed.

The first columnar sections 102a, the second columnar sections 102b and the third columnar sections 102c are different in diametrical size from each other. In the example shown in the drawings, the diametrical size of the third columnar sections 102c is larger than the diametrical size of the second columnar sections 102b. Further, the diametrical size of the second columnar sections 102b is larger than the diametrical size of the first columnar sections 102a.

It should be noted that the "diametrical size" corresponds to the diameter in the case in which the planar shape of each of the columnar sections 102a, 102b and 102c is a circle, or in the case in which the planar shape of each of the columnar sections 102a, 102b and 102c is a polygon, the "diametrical size" corresponds to the diameter of the minimum circle (the minimal enclosing circle) including the polygon inside.

By making the first columnar sections 102a, the second columnar sections 102b and the third columnar section 102c different in diametrical size from each other as described above, the light emitted by the light emitting layer 126 in the first columnar sections 102a, the light emitted by the light emitting layer 126 in the second columnar sections 102b and the light emitted by the light emitting layer 126 in the third columnar sections 102c can be made different in wavelength from each other. In other words, the wavelength of the light La emitted from the first light emitting section 104a, the wavelength of the light Lb emitted from the second light emitting section 104b and the wavelength of the light Lc emitted from the third light emitting section 104c are different from each other.

Further, it is also possible to make the pitch of the first columnar sections 102a in the first light emitting section 104a, the pitch of the second columnar sections 102b in the second light emitting section 104b and the pitch of the third columnar sections 102c in the third light emitting section 104c different from each other. Here, in the first light emitting section 104a, the first columnar sections 102a are arranged regularly with predetermined intervals, and the pitch of the first columnar sections 102a denotes the interval between the first columnar sections 102a arranged regularly. The same applies to the pitch of the second columnar sections 102b and the pitch of the third columnar sections 102c. It is also possible to control the wavelength (the color) of the light emitted from each of the light emitting sections 104a, 104b and 104c by controlling the pitch of each of the columnar sections 102a, 102b and 102c. In other words, in the light emitting element 10, it is possible to realize the multicolor emission by controlling the diametrical sizes or the pitches of the columnar sections 102a, 102b and 102c.

In the light emitting element 10, for example, the light La emitted from the first light emitting section 104a is blue light, the light Lb emitted from the second light emitting section 104b is green light, and the light Lc emitted from the third light emitting section 104c is red light.

Here, in the light emitting element 10, as described later, the columnar sections 102a, 102b and 102c are grown at the same time by a metal organic chemical vapor deposition (MOCVD) method, a molecular beam epitaxy (MBE) method and so on using the mask layer 122 as a mask. On this occasion, by making the columnar sections 102a, 102b and 102c different in diametrical size or pitch from each other, the columnar sections 102a, 102b and 102c are formed so as to be different in height from each other.

Therefore, the first columnar sections 102a, the second columnar sections 102b and the third columnar sections 102c are different in height from each other. In the example shown in the drawings, the height $H_{102a}$ of the first columnar sections 102a is larger than the height $H_{102b}$ of the second columnar sections 102b. Further, the height $H_{102b}$ of the second columnar sections 102b is larger than the height $H_{102c}$ of the third columnar sections 102c.

It should be noted that the height $H_{102a}$, $H_{102b}$ and $H_{102c}$ is a size in the stacking direction of the columnar sections 102a, 102b and 102c. The height $H_{102a}$, $H_{102b}$ and $H_{102c}$ is, for example, a sum of the film thicknesses of the plurality of layers constituting the columnar sections 102a, 102b and 102c, and is a sum of the film thickness of the first semiconductor layer 124, the film thickness of the light emitting layer 126, and the film thickness of the second semiconductor layer 128 in the example shown in the drawings.

The light emitting sections 104a, 104b and 104c can be different in area from each other. In other words, the areas of the regions in which the columnar sections 102a, 102b and 102c are respectively formed can be different from each other. For example, it is possible to change the areas of the light emitting sections 104a, 104b and 104c in accordance with the emission efficiencies of the columnar sections 102a, 102b and 102c, respectively.

For example, in the case in which the emission efficiency of the third columnar sections 102c for emitting the red light is lower than the emission efficiency of the first columnar sections 102a for emitting the blue light, the area (i.e., the area of the region in which the plurality of third columnar sections 102c is formed) of the third light emitting section 104c is made larger than the area (i.e., the area of the region in which the plurality of first columnar sections 102a is formed) of the first light emitting section 104a. Thus, it is possible to achieve homogenization of the light intensities of the red light and the blue light emitted from the light emitting element 10. It should be noted that it is also possible for the light emitting sections 104a, 104b and 104c to be equal in area to each other.

between the first columnar sections 102a adjacent to each other, there is disposed the insulating layer 129. The insulating layer 129 is embedded between the first columnar sections 102a adjacent to each other. The insulating layer 129 is disposed between the mask layer 122 and the second electrode 140a. The insulating layer 129 is, for example, a silicon oxide layer, a silicon oxynitride layer, an aluminum oxide layer, a hafnium oxide layer, a GaN layer and an InGaN layer. The light generated in the light emitting layer 126 passes through the insulating layer 129 to propagate in the planar direction. Similarly, the insulating layer 129 is disposed between the second columnar sections 102b adjacent to each other, and between the third columnar sections 102c adjacent to each other.

The first electrode 130 is disposed on the buffer layer 121. The first electrode 130 is disposed between a conductive member 8d and the buffer layer 121. The first electrode 130 is electrically connected to the first semiconductor layer 124. The first electrode 130 and the buffer layer 121 have ohmic contact with each other. The first electrode 130 is one of the electrodes for injecting the current into the light emitting layer 126. The first electrode 130 is an electrode common to the first columnar sections 102a (the first light emitting section 104a), the second columnar sections 102b (the second light emitting section 104b) and the third columnar sections 102c (the third light emitting section 104c). As the first electrode 130, there is used, for example, a metal layer such as an Au layer or an Ag layer, and what is obtained by stacking a Cr layer, an Ni layer and an Au layer in this order from the buffer layer 121 side.

The second electrode 140a is provided to the plurality of first columnar sections 102a. The second electrode 140a is disposed between the plurality of first columnar sections 102a (the second semiconductor layer 128) and the first conductive member 8a. The second electrode 140a is electrically connected to the second semiconductor layer 128. The second electrode 140a is an electrode common to the plurality of first columnar sections 102a. The second electrode 140a and the second semiconductor layer 128 have ohmic contact with each other. The second electrode 140a is the other of the electrodes for injecting the current into the light emitting layer 126 of each of the first columnar sections 102a.

The second electrode 140b is provided to the plurality of second columnar sections 102b. The second electrode 140b is disposed between the plurality of second columnar sections 102b (the second semiconductor layer 128) and a second conductive member 8b. The second electrode 140b is electrically connected to the second semiconductor layer 128. The second electrode 140b is an electrode common to the plurality of second columnar sections 102b. The second electrode 140b and the second semiconductor layer 128 have ohmic contact with each other. The second electrode 140b is the other of the electrodes for injecting the current into the light emitting layer 126 of each of the second columnar sections 102b.

The second electrode 140c is provided to the plurality of third columnar sections 102c. The second electrode 140c is disposed between the plurality of third columnar sections 102c (the second semiconductor layer 128) and a third conductive member 8c. The second electrode 140c is electrically connected to the second semiconductor layer 128. The second electrode 140c is an electrode common to the plurality of third columnar sections 102c. The second electrode 140c and the second semiconductor layer 128 have ohmic contact with each other. The second electrode 140c is the other of the electrodes for injecting the current into the light emitting layer 126 of each of the third columnar sections 102c.

As the second electrode 140a, 140b and 140c, there is used a metal layer such as an Au layer or an Ag layer, what is obtained by stacking a Pd layer, a Pt layer and an Au layer in this order from the second semiconductor layer 128 side, and so on. The material of the first electrode 130 and the material of the second electrode 140a, 140b and 140c can be the same as each other, or can also be different from each other.

In the light emitting device 100, the light emitting element 10 is mounted on the second base member 20 using the junction-down mounting. In other words, in the light emitting device 100, the stacked body 120 is connected to the second base member 20 on the opposite side to the first base member 110 side.

The second base member 20 is provided with the light emitting element 10. On the second base member 20, there is mounted the light emitting element 10. The second base member 20 has interconnections 22a, 22b, 22c and 22d. The second base member 20 is a mounting board for mounting the light emitting element 10.

It is preferable for the thermal expansion coefficient of the second base member 20 to be approximate to the thermal expansion coefficient of the first base member 110. Thus, it is possible to reduce warp of the first base member due to the heat applied when mounting the light emitting element 10 on the second base member 20, and the heat generation when driving the light emitting element 10, and thus, it is possible to reduce stress applied to the light emitting element 10. Further, the thermal conductivity of the second base member 20 is preferably higher than the thermal conductivity of, for example, the stacked body 120, and is further preferably higher than the thermal conductivity of the first base member 110. Further, it is preferable for the thermal capacity of the second base member 20 to be higher than the thermal capacity of the first base member 110. Thus, it is possible to enhance the heat radiation performance of the heat generated in the light emitting element 10 (the stacked body 120).

As the second base member 20, there is used, for example, a semiconductor substrate such as an SiC substrate, or a ceramics substrate such as an AlN substrate. The semiconductor material such as SiC and the ceramics material such as AlN are high in thermal conductivity, and at the same time, high in electrical insulation property. Therefore, by using such a substrate as the second base member 20, the heat radiation performance of the light emitting element 10 can be enhanced, and at the same time, insulation of the interconnections 22a, 22b, 22c and 22d is easy. It should be noted that it is also possible to use a metal substrate such as a CuW substrate or a CuMo substrate as the second base member 20. In this case, an insulating layer or the like for insulating the interconnections 22a, 22b, 22c and 22d is disposed.

The first conductive member 8a is a bump for electrically connecting the second electrode 140a of the first columnar sections 102a and the interconnection 22a of the second base member 20 to each other. The second conductive member 8b is a bump for electrically connecting the second electrode 140b of the second columnar sections 102b and the interconnection 22b of the second base member 20 to each other. The third conductive member 8c is a bump for electrically connecting the second electrode 140c of the third columnar sections 102c and the interconnection 22c of the second base member 20 to each other. The conductive member 8d is a bump for electrically connecting the first electrode 130 and the interconnection 22d of the second base member 20 to each other.

between the first base member 110 and the second base member 20, the first columnar sections 102a (the second electrode 140a) and the interconnection 22a of the second base member 20 are electrically connected to each other via the first conductive member 8a. Further, the second columnar sections 102b (the second electrode 140b) and the interconnection 22b of the second base member 20 are electrically connected to each other via the second conductive member 8b. Further, the third columnar sections 102c (the second electrode 140c) and the interconnection 22c of the second base member 20 are electrically connected to each other via the third conductive member 8c. Further, the first electrode 130 and the interconnection 22d of the second base member 20 are electrically connected to each other via the conductive member 8d.

The material of the conductive members 8a, 8b, 8c and 8d is, for example, gold, nickel, copper, or an alloy of any of these metals. The conductive members 8a, 8b, 8c and 8d and the interconnections 22a, 22b, 22c and 22d are bonded to each other with a bonding member 7, respectively. The bonding member 7 is, for example, solder.

The height $H_{8b}$ of the second conductive member 8b is larger than the height $H_{8a}$ of the first conductive member 8a. The height $H_{8c}$ of the third conductive member 8c is larger than the height $H_{8b}$ of the second conductive member 8b. In the example shown in the drawings, a sum of the height $H_{8a}$ of the first conductive member 8a and the height $H_{102a}$ of the first columnar sections 102a, a sum of the height $H_{8b}$ of the second conductive member 8b and the height $H_{102b}$ of the second columnar sections 102b, and a sum of the height $H_{8c}$ of the third conductive member 8c and the height $H_{102c}$ of the third columnar sections 102c are equal to each other. It should be noted that the heights $H_{8a}$, $H_{8b}$ and $H_{8c}$ are sizes in the stacking direction of the conductive members 8a, 8b and 8c, respectively.

between the first base member 110 and the second base member 20, there are disposed the first insulating layer 5 and the second insulating layer 6.

The first insulating layer 5 is disposed between the conductive members 8a, 8b, 8c and 8d adjacent to each other. The first insulating layer 5 is provided with a first opening section 5a, a second opening section 5b, the third opening section 5c and the opening section 5d. The opening sections 5a, 5b, 5c and 5d each penetrate the first insulating layer 5. In the first opening section 5a, there is disposed the first conductive member 8a. In the second opening section 5b, there is disposed the second conductive member 8b. In the third opening section 5c, there is disposed the third conductive member 8c. In the opening section 5d, there is disposed the conductive member 8d. The material of the first insulating layer 5 is, for example, polyimide, ultraviolet curable resin, silicon oxide or silicon nitride.

The second insulating layer 6 is disposed between the first columnar sections 102a and the second columnar sections 102b, and between the second columnar sections 102b and the third columnar sections 102c. In other words, the second insulating layer 6 is disposed between the first light emitting section 104a and the second light emitting section 104b, and between the second light emitting section 104b and the third light emitting section 104c. The material of the second insulating layer 6 is, for example, polyimide, ultraviolet curable resin, silicon oxide or silicon nitride. The material of the first insulating layer 5 and the material of the second insulating layer 6 can be different from each other, or can also be the same as each other. For example, it is also possible to adopt an inorganic material as the second insulating layer 6, and to adopt an organic material as the first insulating layer 5.

between the first base member 110 and the second base member 20, the first insulating layer 5 is located closer to the second base member 20 than the second insulating layer 6. It should be noted that it is also possible for the first insulating layer 5 and the second insulating layer 6 to be the same layer although not shown in the drawings. In other words, it is also possible that just one insulating layer exists alone between the first base member 110 and the second base member 20.

It should be noted that the case in which the first light emitting section 104a, the second light emitting section 104b and the third light emitting section 104c are each a semiconductor laser using the columnar sections 102a, 102b and 102c (the nanostructures) is described above, but it is also possible for the first light emitting section 104a, the second light emitting section 104b and the third light emitting section 104c to be light emitting elements partially resonating using the nanostructures, or the light emitting diodes (LED) using the nanostructures.

The light emitting device 100 has, for example, the following features.

In the light emitting device 100, the stacked body 120 includes the first columnar sections 102a having the height $H_{102a}$, the second columnar sections 102b having the height $H_{102b}$ smaller than the height $H_{102a}$, and the third columnar sections 102c having the height $H_{102c}$ smaller than the height $H_{102b}$. Further, between the stacked body 120 and the second base member 20, the first columnar sections 102a and the second base member 20 are electrically connected to each other via the first conductive member 8a, the second columnar sections 102b and the second base member 20 are electrically connected to each other via the second conductive member 8b, and the third columnar sections 102c and the second base member 20 are electrically connected to each other via the third conductive member 8c. Further, the height $H_{8c}$ of the third conductive member 8c is larger than the height $H_{8b}$ of the second conductive member 8b, and the height $H_{8b}$ of the second conductive member 8b is larger than the height $H_{8a}$ of the first conductive member 8a.

As described above, in the light emitting device 100, since the height $H_{8b}$ of the second conductive member 8b is larger than the height $H_{8a}$ of the first conductive member 8a, it is possible to reduce the possibility that the contact failure occurs between the second columnar sections 102b and the second base member 20. Further, since the height $H_{8c}$ of the third conductive member 8c is larger than the height $H_{8b}$ of the second conductive member 8b, it is possible to reduce the possibility that the contact failure occurs between the third columnar sections 102c and the second base member 20. Therefore, in the light emitting device 100, it is possible to enhance the connection stability between the light emitting element 10 and the second base member 20 (the mounting board).

Further, in the light emitting device 100, it is possible to mount the light emitting element 10 horizontally with respect to the second base member 20. For example, in the case in which the heights $H_{102a}$, $H_{102b}$ and $H_{102c}$ of the respective columnar sections 102a, 102b and 102c are different from each other, if the heights of the conductive members 8a, 8b and 8c are made equal to each other, the light emitting element 10 is mounted obliquely with respect to the second base member 20. In contrast, in the light emitting device 100, since the height $H_8c$ of the third conductive member 8c is larger than the height $H_{8b}$ of the second conductive member 8b, and the height $H_{8b}$ of the second conductive member 8b is larger than the height $H_{8a}$ of the first conductive member 8a, it is possible to decrease the tilt of the light emitting element 10 with respect to the second base member 20 compared to the case in which the heights of the conductive members 8a, 8b and 8c are the same, or to eliminate the tilt.

In the light emitting device 100, the first columnar sections 102a, the second columnar sections 102b and the third columnar sections 102c each include the first semiconductor layer 124, the second semiconductor layer 128 and the light emitting layer 126. Therefore, in the light emitting device 100, it is possible to obtain the first semiconductor layer 124, the second semiconductor layer 128 and the light emitting layer 126 with crystal defects and dislocations reduced, and thus, it is possible to realize the light emitting element 10 high in efficiency.

In the light emitting device 100, the first insulating layer 5 is disposed between the first base member 110 and the second base member 20, the first conductive member 8a is disposed in the first opening section 5a provided to the first insulating layer 5, the second conductive member 8b is disposed in the second opening section 5b provided to the first insulating layer 5, and the third conductive member 8c is disposed in the third opening section 5c provided to the first insulating layer 5. Therefore, in the light emitting device 100, it is possible to reduce the possibility that the conductive members 8a, 8b and 8c are electrically shorted.

In the light emitting device 100, the second insulating layer 6 is disposed between the first columnar sections 102a and the second columnar sections 102b, and between the second columnar sections 102b and the third columnar sections 102c. Therefore, in the light emitting device 100, it is possible to reduce the diffusion of the light generated in the columnar sections 102a, 102b and 102c due to the second insulating layer 6. It should be noted that it is preferable for the second insulating layer 6 to have the lower refractive index than the refractive index of GaN or InGaN.

In the light emitting device 100, the wavelength of the light emitted by the light emitting layer 126 in the first columnar sections 102a, the wavelength of the light emitted by the light emitting layer 126 in the second columnar sections 102b, and the wavelength of the light emitted by the light emitting layer 126 in the third columnar sections 102c are different from each other. Therefore, in the light emitting device 100, the multicolor emission can be achieved with a single substrate (the first base member 110).

1.2. Manufacturing Method

Figure 2:
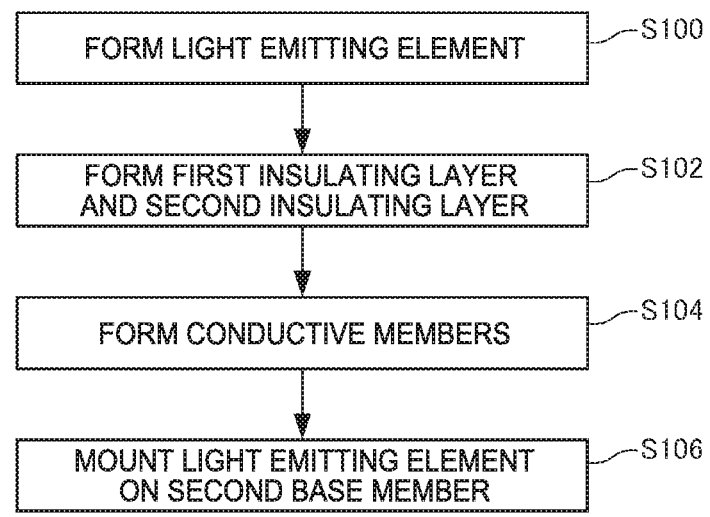
FIG. 2 is a flowchart showing an example of a method of manufacturing the light emitting device according to the first embodiment.
Figure 3:
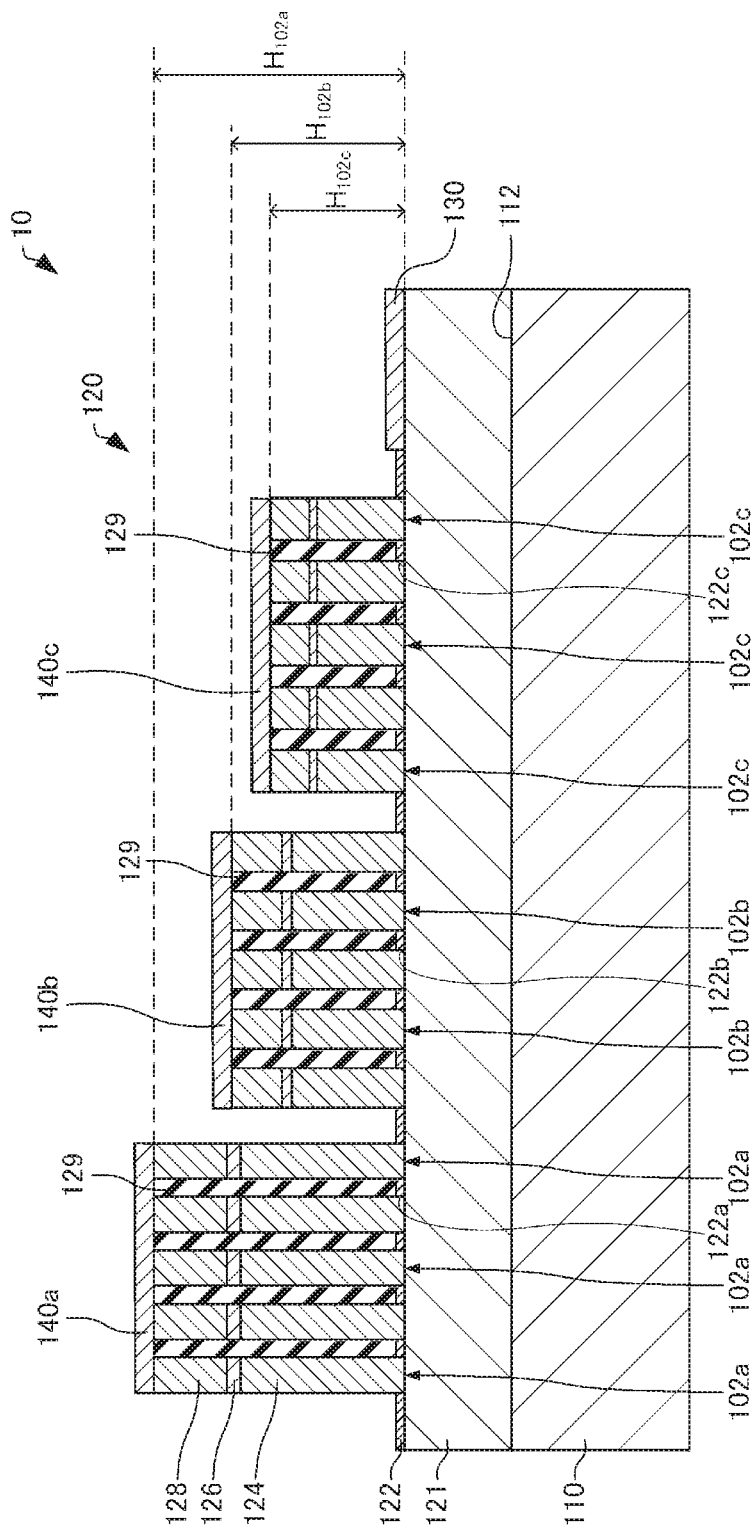
FIG. 3 is a cross-sectional view schematically showing a manufacturing process of the light emitting device according to the first embodiment.
Figure 4:
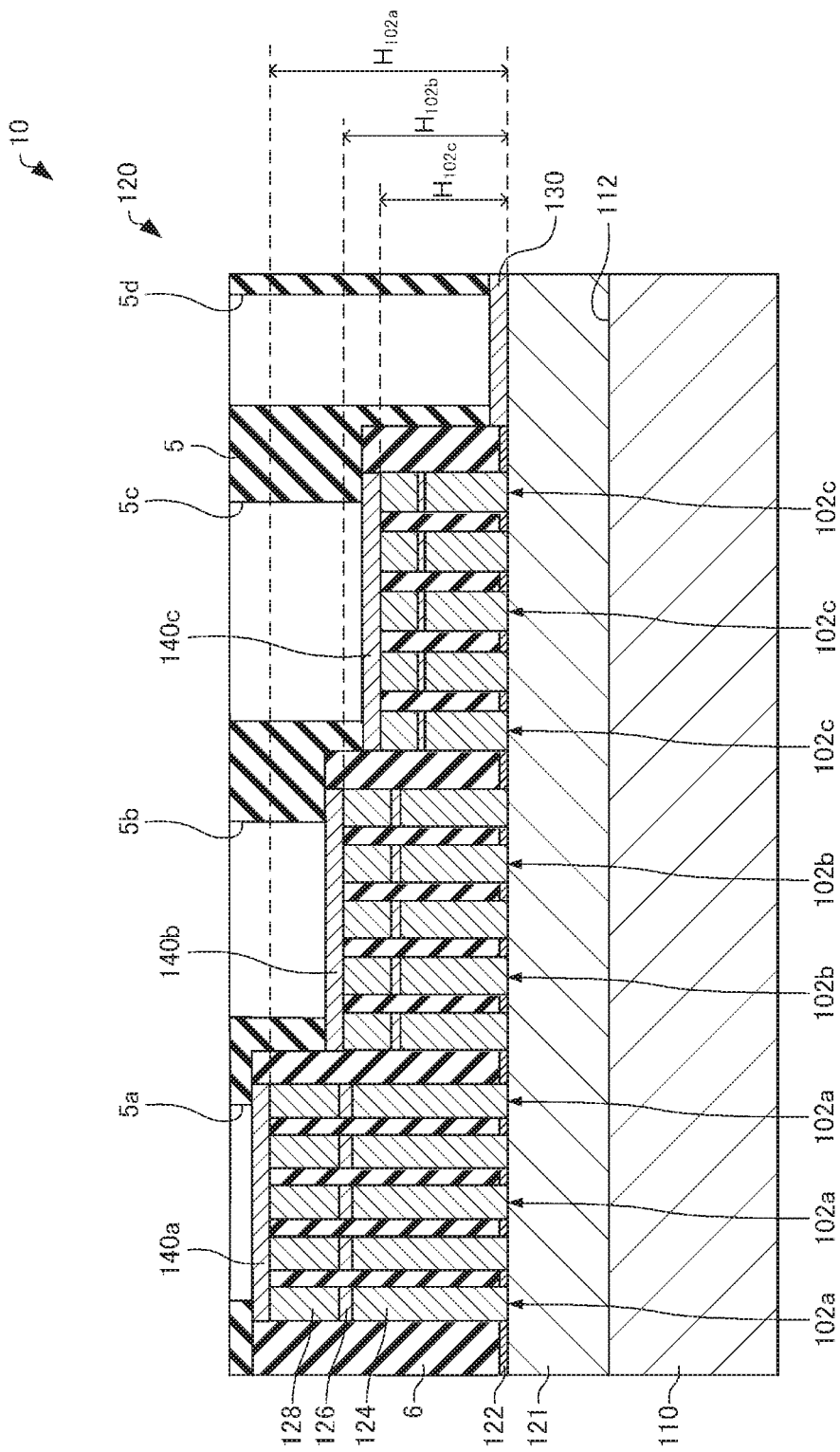
FIG. 4 is a cross-sectional view schematically showing the manufacturing process of the light emitting device according to the first embodiment.
Figure 5:
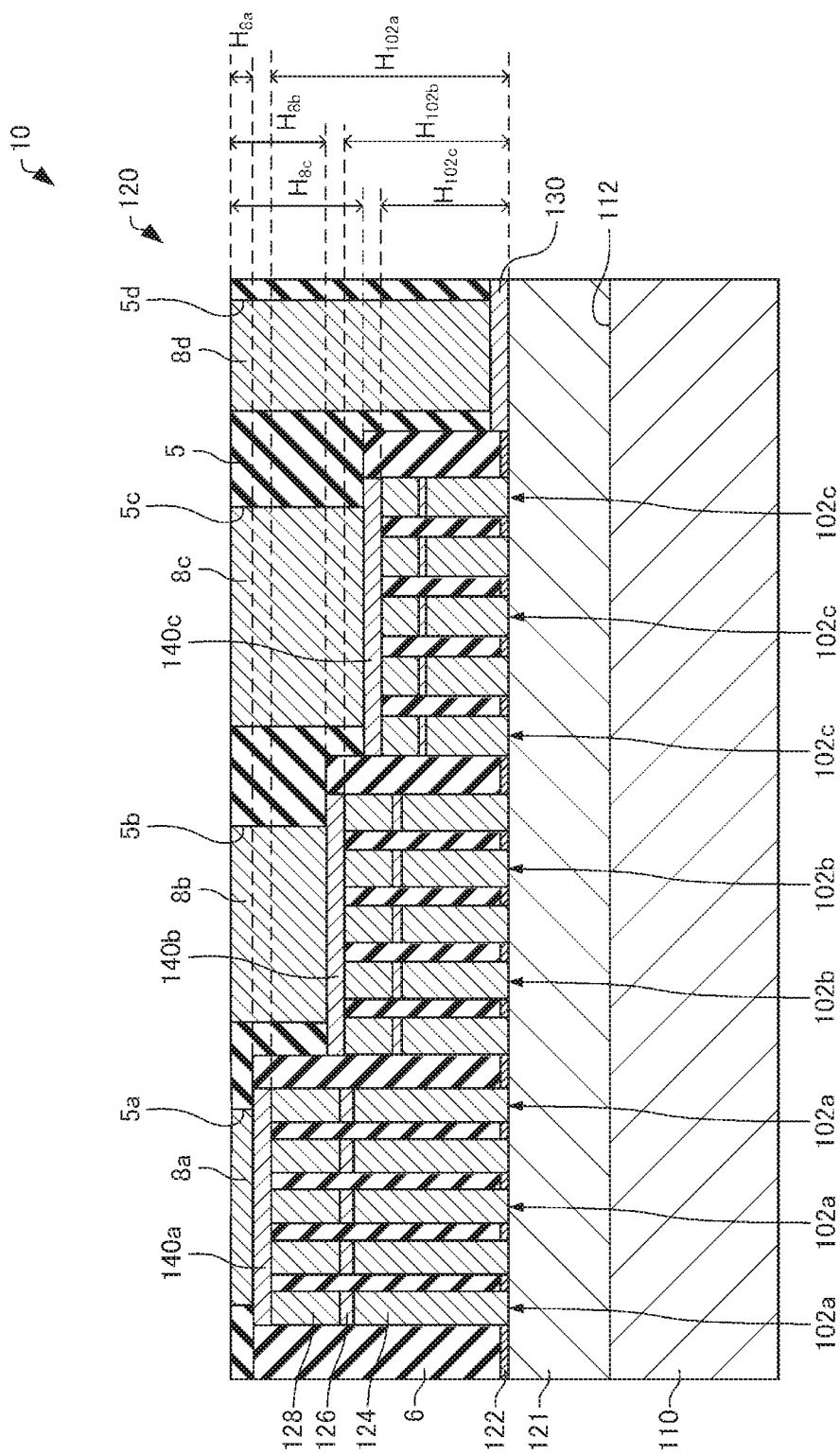
FIG. 5 is a cross-sectional view schematically showing the manufacturing process of the light emitting device according to the first embodiment.

Then, a method of manufacturing the light emitting device 100 according to the first embodiment will be described with reference to the accompanying drawings. FIG. 2 is a flowchart showing an example of the method of manufacturing the light emitting device according to the first embodiment. FIG. 3 through FIG. 5 are cross-sectional views schematically showing a manufacturing process of the light emitting device 100 according to the first embodiment.

Firstly, as shown in FIG. 3, the light emitting element 10 is formed (S100).

Specifically, firstly, as shown in FIG. 3, the buffer layer 121 is grown epitaxially on the first base member 110. As the method of growing the layer epitaxially, there can be cited, for example, the metal organic chemical vapor deposition (MOCVD) method, and the molecular beam epitaxy (MBE) method.

Then, the mask layer 122 is formed on the buffer layer 121. In the mask layer 122, there are formed through holes 122a for forming the first columnar sections 102a, through holes 122b for forming the second columnar sections 102b, and through holes 122c for forming the third columnar sections 102c. The diametrical size of the through holes 122a is larger than the diametrical size of the through holes 122b, and the diametrical size of the through holes 122b is larger than the diametrical size of the through holes 122c. By the through holes 122a, 122b and 122c being formed in the mask layer 122, the buffer layer 121 is exposed. The mask layer 122 is formed by deposition using the MOCVD method, the MBE method, or the like, and patterning with a photolithography technique and an etching technique.

Then, the first semiconductor layer 124, the light emitting layer 126 and the second semiconductor layer 128 are epitaxially grown on the buffer layer 121 in this order using the MOCVD method, the MBE method or the like using the mask layer 122 as a mask. Here, the larger the diametrical size of the through holes 122a, 122b and 122c provided to the mask layer 122 is, the larger the diametrical size of the columnar sections 102a, 102b and 102c formed becomes, and the lower the height becomes. Therefore, it is possible to form the first columnar sections 102a having the height $H_{102a}$, the second columnar sections 102b having the height $H_{102b}$, and the third columnar sections 102c having the height $H_{102c}$ in the same process. Due to the process described above, it is possible to form the stacked body 120 including the columnar sections 102a, 102b and 102c on the first base member 110.

It should be noted that it is also possible to remove the mask layer 122 after forming the stacked body 120. In this case, the light emitting element 10 does not include the mask layer 122.

Then, the insulating layer 129 is formed between the first columnar sections 102a adjacent to each other, between the second columnar sections 102b adjacent to each other, and between the third columnar sections 102c adjacent to each other, respectively. The insulating layer 129 is formed using, for example, a spin coat method or an atomic layer deposition (ALD) method.

Then, the second electrode 140a is formed on the second semiconductor layer 128 of each of the first columnar sections 102a, the second electrode 140b is formed on the second semiconductor layer 128 of each of the second columnar sections 102b, the second electrode 140c is formed on the second semiconductor layer 128 of each of the third columnar sections 102c.

Then, the first electrode 130 is formed on the buffer layer 121. The first electrode 130 and the second electrodes 140a, 140b and 140c are formed using, for example, a vacuum deposition method. It should be noted that the order of forming the first electrode 130 and the second electrodes 140a, 140b and 140c is not particularly limited.

According to the process described hereinabove, the light emitting element 10 can be formed.

Then, as shown in FIG. 4, the first insulating layer 5 and the second insulating layer 6 are formed on the mask layer 122 (S102).

Specifically, firstly, the second insulating layer 6 is formed on the mask layer 122. The second insulating layer 6 is formed using, for example, a spin coat method, an ALD method, or a chemical vapor deposition (CVD) method. Then, the first insulating layer 5 is formed on the second insulating layer 6. The opening sections 5a, 5b, 5c and 5d are formed in the first insulating layer 5. By forming the opening sections 5a, 5b, 5c and 5d, the second electrodes 140a, 140b and 140c and the first electrode 130 are exposed. The first insulating layer 5 functions as a mask when forming the conductive members 8a, 8b, 8c and 8d. The first insulating layer 5 is formed by deposition using, for example, the spin coat method, the ALD method, or the CVD method, and patterning using the photolithography technique and the etching technique.

It should be noted that in the case in which the material of the first insulating layer 5 and the material of the second insulating layer 6 are the same, the deposition of the first insulating layer 5 and the deposition of the second insulating layer 6 can also be performed at the same time.

Then, as shown in FIG. 5, the first conductive member 8a is formed on the first columnar sections 102a, the second conductive member 8b is formed on the second columnar sections 102b, and the third conductive member 8c is formed on the third columnar sections 102c, and the conductive member 8d is formed on the first electrode 130 (S104).

Specifically, the conductive members 8a, 8b and 8c are formed on the second electrodes 140a, 140b and 140c, and the conductive member 8d is formed on the first electrode 130 using the first insulating layer 5 as a mask. In other words, the first conductive member 8a is formed on the second electrode 140*a* exposed by the first opening section 5*a* of the first insulating layer 5. Similarly, the second conductive member 8*b* is formed on the second electrode 140*b* exposed by the second opening section 5*b* of the first insulating layer 5. Similarly, the third conductive member 8*c* is formed on the second electrode 140*c* exposed by the third opening section 5*c* of the first insulating layer 5. Similarly, the conductive member 8*d* is formed on the first electrode 130 exposed by the opening section 5*d* of the first insulating layer 5. The conductive members 8*a*, 8*b*, 8*c* and 8*d* are formed using, for example, an electrolytic plating method, an electroless plating method, a vacuum deposition method, or a sputtering method. It should be noted that it is also possible to planarize the upper surfaces of the conductive members 8*a*, 8*b*, 8*c* and 8*d* and the upper surface of the first insulating layer 5 by grinding or a cutting work after forming the conductive members 8*a*, 8*b*, 8*c* and 8*d*.

Due to the present process, the height Hu, of the second conductive member 8*b* is made larger than the height $H_{8a}$ of the first conductive member 8*a*, and the height $H_{8c}$ of the third conductive member 8*c* is made larger than the height $H_{8b}$ of the second conductive member 8*b*.

Then, as shown in FIG. 1, the light emitting element is mounted on the second base member 20 with the junction-down mounting (S106).

Specifically, between the stacked body 120 and the second base member 20, the second electrode 140*a* of the first columnar sections 102*a* and the interconnection 22*a* of the second base member 20 are electrically connected to each other via the first conductive member 8*a*. The first conductive member 8*a* and the interconnection 22*a* are bonded to each other with a bonding member 7 such as solder. Similarly, between the stacked body 120 and the second base member 20, the second electrode 140*b* of the second columnar sections 102*b* and the interconnection 22*b* of the second base member 20 are electrically connected to each other via the second conductive member 8*b*. Similarly, between the stacked body 120 and the second base member 20, the second electrode 140*c* of the third columnar sections 102*c* and the interconnection 22*c* of the second base member 20 are electrically connected to each other via the third conductive member 8*c*. Similarly, between the first base member 110 and the second base member 20, the first electrode 130 and the interconnection 22*d* of the second base member 20 are electrically connected to each other via the conductive member 8*d*.

More specifically, for example, the bonding member 7 (solder) is firstly formed on the interconnections 22*a*, 22*b*, 22*c* and 22*d* on the second base member 20 using a printing method or the like. Then, the light emitting element 10 is positioned on the second base member 20 so that the first conductive member 8*a* is disposed on the interconnection 22*a*, the second conductive member 8*b* is disposed on the interconnection 22*b*, the third conductive member 8*c* is disposed on the interconnection 22*c*, and the conductive member 8*d* is disposed on the interconnection 22*d*. Then, the bonding member 7 is heated in this state. Thus, the first conductive member 8*a* and the interconnection 22*a* are bonded to each other, the second conductive member 8*b* and the interconnection 22*b* are bonded to each other, the third conductive member 8*c* and the interconnection 22*c* are bonded to each other, and the conductive member 8*d* and the interconnection 22*d* are bonded to each other. Due to the process described hereinabove, it is possible to mount the light emitting element 10 on the second base member 20 with the junction-down mounting.

According to the process described hereinabove, the light emitting device 100 can be manufactured.

The method of manufacturing the light emitting device 100 according to the first embodiment has, for example, the following features.

The method of manufacturing the light emitting device 100 according to the first embodiment includes the process of forming the stacked body 120 including the first columnar sections 102*a* having the height $H_{102a}$, the second columnar sections 102*b* having the height $H_{102b}$ smaller than the height $H_{102a}$, and the third columnar sections 102*c* having the height $H_{102c}$ smaller than the height $H_{102b}$ on the first base member 110 to form the light emitting element 10, the process of forming the first conductive member 8*a* having the height $H_{8a}$ on the first columnar sections 102*a*, forming the second conductive member 8*b* having the height $H_{8b}$ larger than the height $H_{8a}$ on the second columnar sections 102*b*, and forming the third conductive member 8*c* having the height $H_{8c}$ larger than the height $H_{8b}$ on the third columnar sections 102*c*, and the process of mounting the light emitting element 10 on the second base member 20. Further, in the process of mounting the light emitting element 10 on the second base member 20, between the stacked body 120 and the second base member 20, the first columnar sections 102*a* and the second base member 20 are electrically connected to each other via the first conductive member 8*a*, the second columnar sections 102*b* and the second base member 20 are electrically connected to each other via the second conductive member 8*b*, and the third columnar sections 102*c* and the second base member 20 are electrically connected to each other via the third conductive member 8*c*.

As described above, in the method of manufacturing the light emitting device according to the first embodiment, since the height $H_{8b}$ of the second conductive member 8*b* is made larger than the height $H_{8a}$ of the first conductive member 8*a*, it is possible to reduce the possibility that the contact failure occurs between the second columnar sections 102*b* and the second base member 20. Further, since the height $H_{8c}$ of the third conductive member 8*c* is made larger than the height $H_{8b}$ of the second conductive member 8*b*, it is possible to reduce the possibility that the contact failure occurs between the third columnar sections 102*c* and the second base member 20. Therefore, in the method of manufacturing the light emitting device according to the first embodiment, it is possible to enhance the connection stability between the light emitting element 10 and the second base member 20 (the mounting board).

Further, in the method of manufacturing the light emitting device according to the first embodiment, since it is possible to use the first insulating layer 5 as a mask when forming the conductive members 8*a*, 8*b*, 8*c* and 8*d*, it is possible to simplify the manufacturing process.

1.3. Modified Example

Then, a modified example of the method of manufacturing the light emitting device 100 according to the first embodiment will be described. In the embodiment described above, the first insulating layer 5 is formed, and then the conductive members 8*a*, 8*b*, 8*c* and 8*d* are formed using the first insulating layer 5 as a mask. In contrast, in the present modified example, the first insulating layer 5 is formed after forming the conductive members 8*a*, 8*b*, 8*c* and 8*d*. Hereinafter, differences from the method of manufacturing the light emitting device according to the first embodiment shown in FIG. 2 described above will be explained, and the description of similarities will be omitted.

Figure 6:
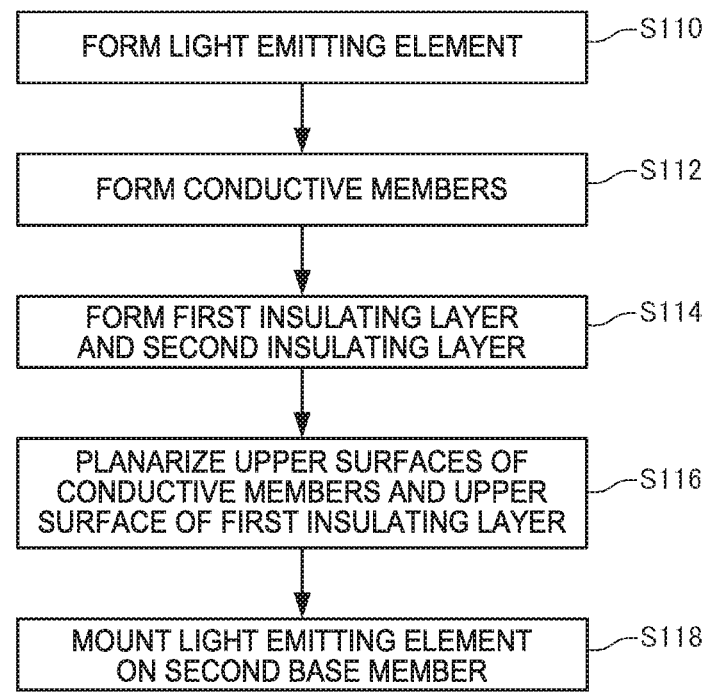
FIG. 6 is a flowchart showing a modified example of the method of manufacturing the light emitting device according to the first embodiment.
Figure 7:
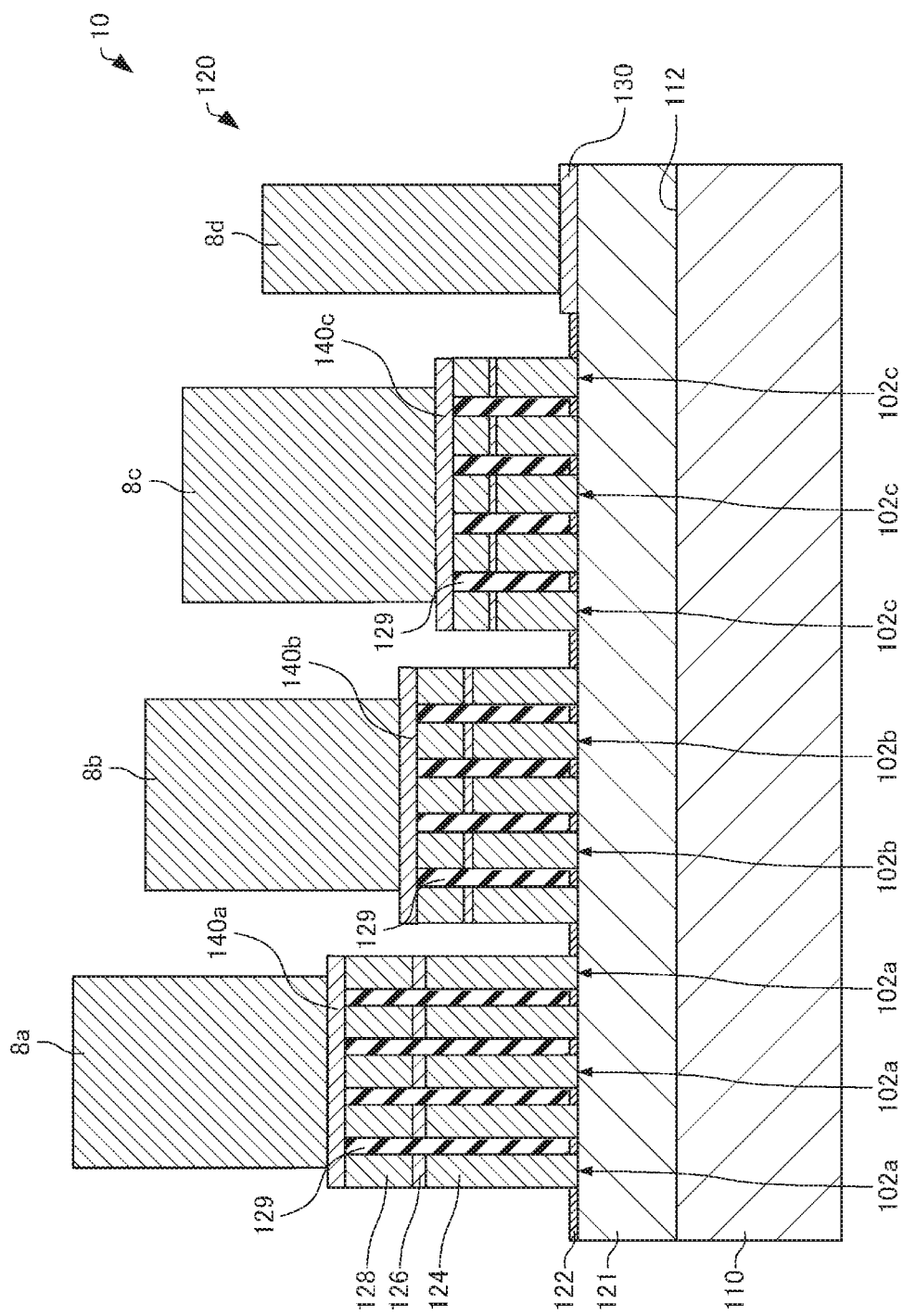
FIG. 7 is a cross-sectional view schematically showing a modified example of the manufacturing process of the light emitting device according to the first embodiment.
Figure 8:
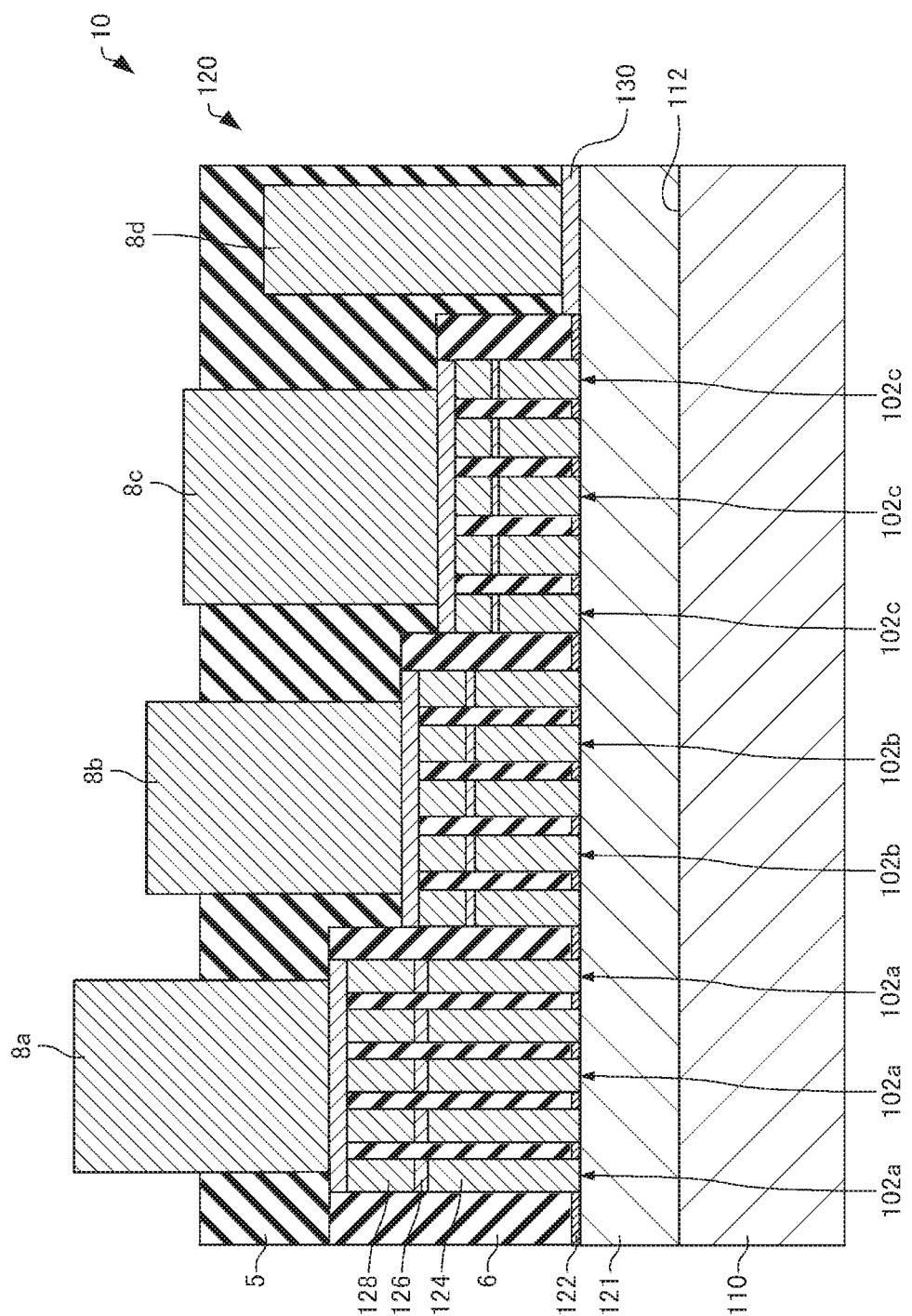
FIG. 8 is a cross-sectional view schematically showing the modified example of the manufacturing process of the light emitting device according to the first embodiment.

FIG. 6 is a flowchart showing the modified example of the method of manufacturing the light emitting device according to the first embodiment. FIG. 7 and FIG. 8 are cross-sectional views schematically showing the modified example of the manufacturing process of the light emitting device according to the first embodiment.

Firstly, as shown in FIG. 3, the light emitting element 10 is formed (S110).

The present process S110 is performed in substantially the same manner as the process S100 shown in FIG. 2 described above.

Then, as shown in FIG. 7, the conductive members 8a, 8b, 8c and 8d are formed (S112).

The conductive members 8a, 8b, 8c and 8d are formed using the electrolytic plating method, the electroless plating method, the vacuum deposition method, the sputtering method or the like. In the case of forming the conductive members 8a, 8b, 8c and 8d using the electrolytic plating method or the electroless plating method, for example, a mask layer (not shown) is formed, and then the conductive members 8a, 8b, 8c and 8d are formed with the electrolytic plating method or the electroless plating method using the mask layer as a mask. Further, in the case of forming the conductive members 8a, 8b, 8c and 8d with the vacuum deposition method, the sputtering method, or the like, a liftoff method, for example, is used.

Then, as shown in FIG. 8, the first insulating layer 5 and the second insulating layer 6 are formed (S114).

Specifically, the second insulating layer 6 is formed on the mask layer 122, and the first insulating layer 5 is formed on the second insulating layer 6. The first insulating layer 5 and the second insulating layer 6 are formed using, for example, the spin coat method, the ALD method, or the CVD method.

Then, as shown in FIG. 5, the upper surfaces of the conductive members 8a, 8b, 8c and 8d and the upper surface of the first insulating layer 5 are planarized by grinding or the cutting work (S116). Thus, the height $H_u$ of the second conductive member 8b is made larger than the height $H_{8a}$ of the first conductive member 8a, and the height $H_{8c}$ of the third conductive member 8c is made larger than the height $H_8 b$ of the second conductive member 8b.

Then, as shown in FIG. 1, the light emitting element 10 is mounted on the second base member 20 (S118).

The present process S118 is performed in substantially the same manner as the process S106 shown in FIG. 2 described above.

According to the process described hereinabove, the light emitting device 100 can be manufactured.

In the method of manufacturing the light emitting device according to the present modified example, it is possible to exert substantially the same functions and advantages as those of the method of manufacturing the light emitting device according to the first embodiment described above.

2. Second Embodiment 2.1. Light Emitting Device

Figure 9:
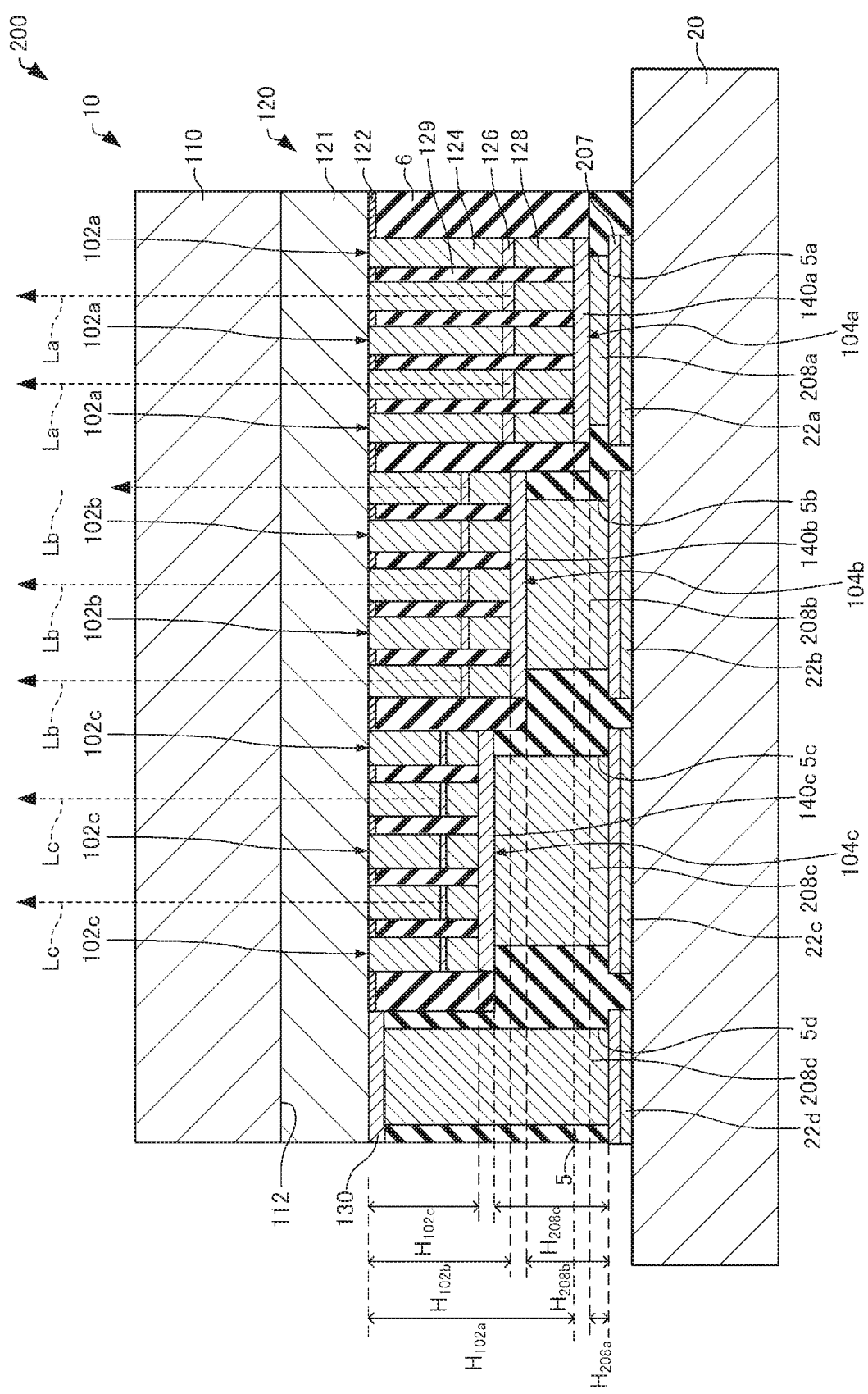
FIG. 9 is a cross-sectional view schematically showing a light emitting device according to a second embodiment of the invention.

Then, a light emitting device according to a second embodiment will be described with reference to the accompanying drawings. FIG. 9 is a cross-sectional view schematically showing the light emitting device 200 according to the second embodiment. Hereinafter, in the light emitting device 200 according to the second embodiment, the members having the same functions as those of the constituent members of the light emitting device 100 according to the first embodiment described above will be denoted by the same reference symbols, and detailed description thereof will be omitted.

In the light emitting device 100 described above, the conductive members 8a, 8b and 8c for electrically connecting the second electrodes 140a, 140b and 140c and the interconnections 22a, 22b and 22c of the second base member 20 to each other, and the conductive member 8d for electrically connecting the first electrode 130 and the interconnection 22d of the second base member 20 to each other are each the metal bump formed using the electrolytic plating method, the electroless plating method, or the like.

In contrast, in the light emitting device 200, the conductive members 208a, 208b and 208c for electrically connecting the second electrodes 140a, 140b and 140c and the interconnections 22a, 22b and 22c of the second base member to each other, and the conductive member 208d for electrically connecting the first electrode 130 and the interconnection 22d of the second base member 20 to each other are each formed using a conductive paste.

The conductive paste used when forming the conductive members 208a, 208b, 208c and 208d is, for example, a silver paste. The silver paste is a paste including nano-sized silver particles or micrometer-sized silver particles. It should be noted that it is also possible to use a metal paste including metal particles other than the silver particles as the conductive members 208a, 208b, 208c and 208d.

It should be noted that in the case of forming the conductive members 208a, 208b, 208c and 208d using the conductive paste, it is necessary to perform calcination in the manufacturing process as described later. Therefore, it is preferable for the first insulating layer 5 and the second insulating layer 6 to be made of a material having heat resistance enough to withstand the calcination temperature of the conductive paste.

The height $H_{208b}$ of the second conductive member 208b is larger than the height $H_{208a}$ of the first conductive member 208a. The height $H_{208c}$ of the third conductive member 208c is larger than the height $H_{208b}$ of the second conductive member 208b. In the example shown in the drawings, a sum of the height $H_{208a}$ of the first conductive member 208a and the height $H_{102a}$ of the first columnar sections 102a, a sum of the height $H_{208b}$ of the second conductive member 208b and the height $H_{102b}$ of the second columnar sections 102b, and a sum of the height $H_{208c}$ of the third conductive member 208c and the height $H_{102c}$ of the third columnar sections 102c are equal to each other. It should be noted that the heights $H_{208a}$, $H_{208b}$ and $H_{208c}$ are sizes in the stacking direction of the conductive members 208a, 208b and 208c, respectively.

Further, in the light emitting device 100 described above, the bonding member 7 for bonding the conductive members 8a, 8b, 8c and 8d and the interconnections 22a, 22b, 22c and 22d to each other is solder.

In contrast, in the light emitting device 200, a bonding member 207 for bonding the conductive members 208a, 208b, 208c and 208d and the interconnections 22a, 22b, 22c and 22d to each other is, for example, formed using a conductive paste. The conductive paste used when forming the bonding member 207 and the conductive paste used when forming the conductive members 208a, 208b, 208c and 208d can also be the same material.

In the light emitting device 200, it is possible to exert substantially the same functions and advantages as those of the light emitting device 100 described above.

2.2. Method of Manufacturing Light Emitting Device

Figure 10:
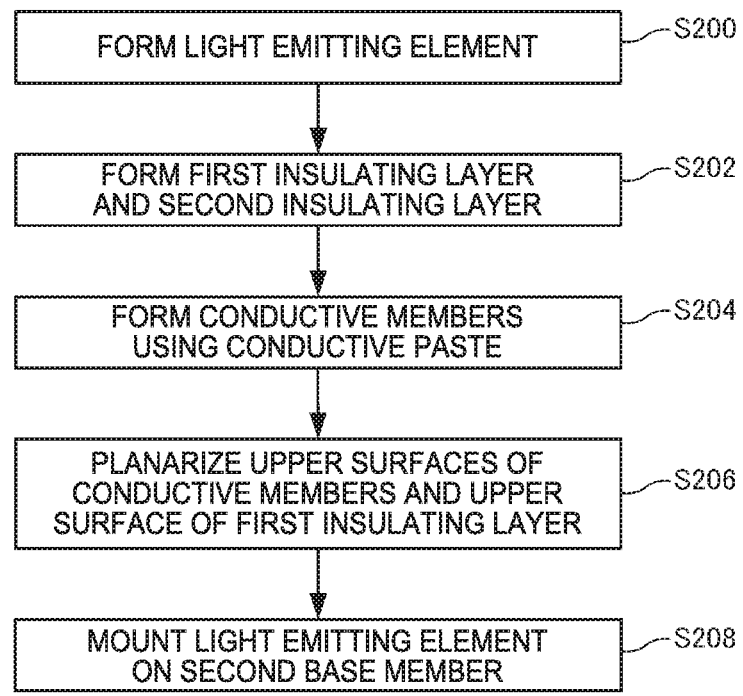
FIG. 10 is a flowchart showing an example of a method of manufacturing the light emitting device according to the second embodiment.
Figure 11:
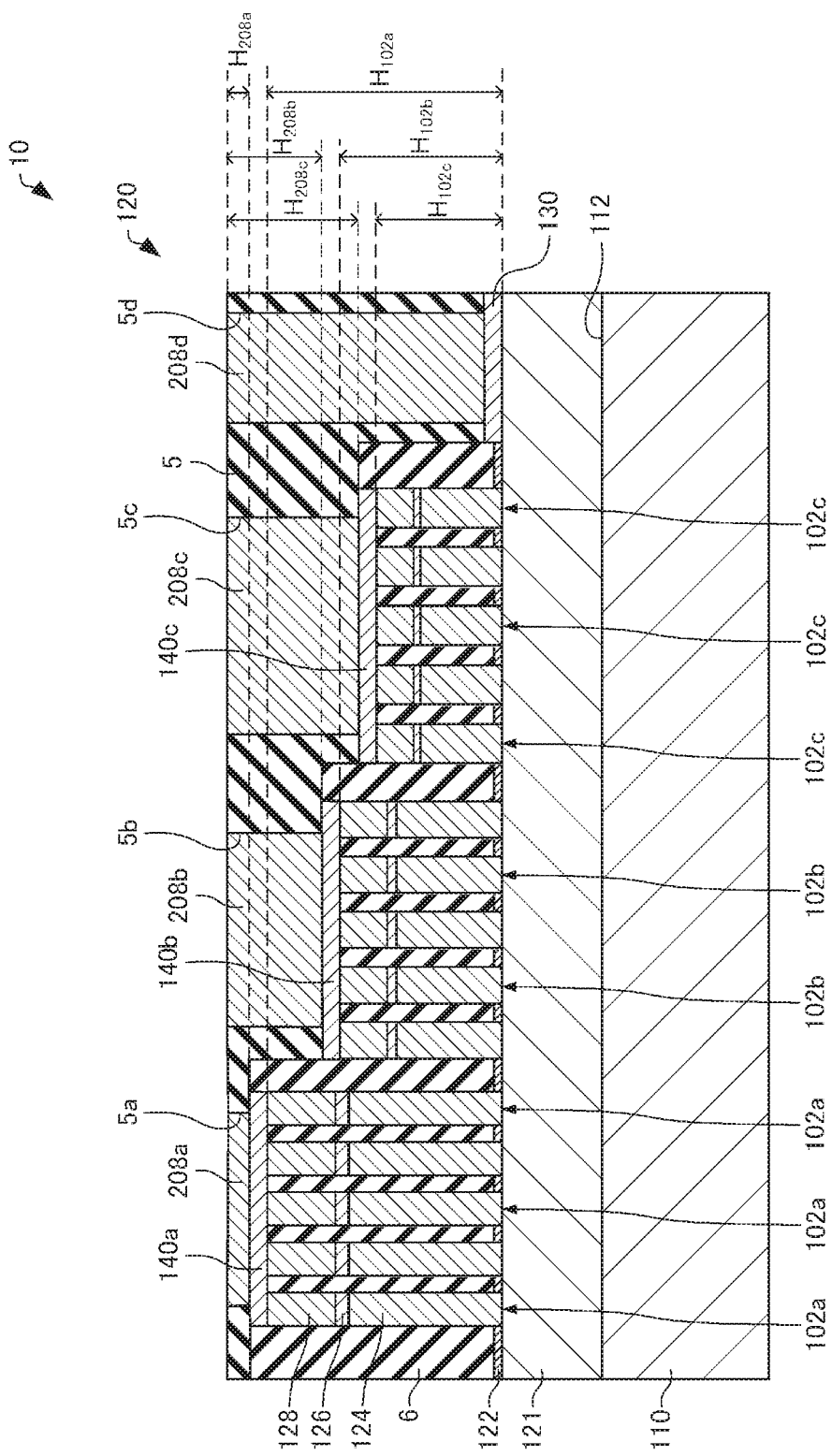
FIG. 11 is a cross-sectional view schematically showing a manufacturing process of the light emitting device according to the second embodiment.

Then, a method of manufacturing the light emitting device according to the second embodiment will be described with reference to the accompanying drawings. FIG. 10 is a flowchart showing an example of the method of manufacturing the light emitting device according to the second embodiment. FIG. 11 is a cross-sectional view schematically showing a manufacturing process of the light emitting device according to the second embodiment. Hereinafter, differences from the method of manufacturing the light emitting device according to the first embodiment shown in FIG. 2 described above will be explained, and the description of similarities will be omitted.

Firstly, as shown in FIG. 3, the light emitting element 10 is formed (S200).

The present process S200 is performed in substantially the same manner as the process S100 shown in FIG. 2 described above.

Then, as shown in FIG. 11, the first insulating layer 5 and the second insulating layer 6 are formed (S202).

The present process S202 is performed in substantially the same manner as the process S102 shown in FIG. 2 described above.

Then, the conductive members 208a, 208b, 208c and 208d are formed using the conductive paste (S204).

Specifically, the conductive paste is formed on the second electrode 140a exposed by the first opening section 5a of the first insulating layer 5. Similarly, the conductive paste is formed on the second electrode 140b exposed by the second opening section 5b of the first insulating layer 5. Similarly, the conductive paste is formed on the second electrode 140c exposed by the third opening section 5c of the first insulating layer 5. Similarly, the conductive paste is formed on the first electrode 130 exposed by the opening section 5d of the first insulating layer 5. These conductive pastes are formed at the same time using, for example, the printing method. Then, the conductive paste are calcined. Thus, the conductive members 208a, 208b, 208c and 208d are formed.

Then, the upper surfaces of the conductive members 208a, 208b, 208c and 208d and the upper surface of the first insulating layer 5 are planarized by grinding or the cutting work (S206). Thus, the height $H_{208b}$ of the second conductive member 208b is made larger than the height $H_{208a}$ of the first conductive member 208a, and the height $H_{208c}$ of the third conductive member 208c is made larger than the height $H_{208b}$ of the second conductive member 208b.

Then, the light emitting element 10 is mounted on the second base member 20 (S208).

Specifically, as shown in FIG. 9, the conductive paste is firstly formed on the interconnections 22a, 22b, 22c and 22d on the second base member 20 using the printing method or the like. Then, the light emitting element 10 is positioned on the second base member 20 so that the first conductive member 208a is disposed on the interconnection 22a, the second conductive member 208b is disposed on the interconnection 22b, the third conductive member 208c is disposed on the interconnection 22c, and the conductive member 208d is disposed on the interconnection 22d. Then, the conductive paste is calcined in this state. Thus, the first conductive member 208a and the interconnection 22a are bonded to each other with the bonding member 207, the second conductive member 208b and the interconnection 22b are bonded to each other with the bonding member 207, the third conductive member 208c and the interconnection 22c are bonded to each other with the bonding member 207, and the conductive member 208d and the interconnection 22d are bonded to each other with the bonding member 207. Due to the process described hereinabove, it is possible to mount the light emitting element 10 on the second base member 20 with the junction-down mounting.

According to the process described hereinabove, the light emitting device 200 can be manufactured.

In the method of manufacturing the light emitting device according to the second embodiment, since the conductive members 208a, 208b, 208c and 208d can be formed by printing and then calcining the conductive paste, a plating solution and a vacuum apparatus are not required, and thus, it is possible to simplify the manufacturing process compared to the case of forming the conductive members using, for example, the plating method, the vacuum deposition method or the like.

2.3. Modified Example

Then, a modified example of the method of manufacturing the light emitting device according to the second embodiment will be described. The modified example of the method of manufacturing the light emitting device according to the first embodiment explained in "1.3. Modified Example" described above can also be applied to the method of manufacturing the light emitting device according to the second embodiment.

Specifically, in the second embodiment described above, the first insulating layer 5 is formed, and then the conductive members 208a, 208b, 208c and 208d are formed using the first insulating layer 5 as a mask. In contrast, in the present modified example, the first insulating layer 5 is formed after forming the conductive members 208a, 208b, 208c and 208d. Hereinafter, differences from the method of manufacturing the light emitting device according to the second embodiment described above will be explained, and the description of similarities will be omitted.

Figure 12:
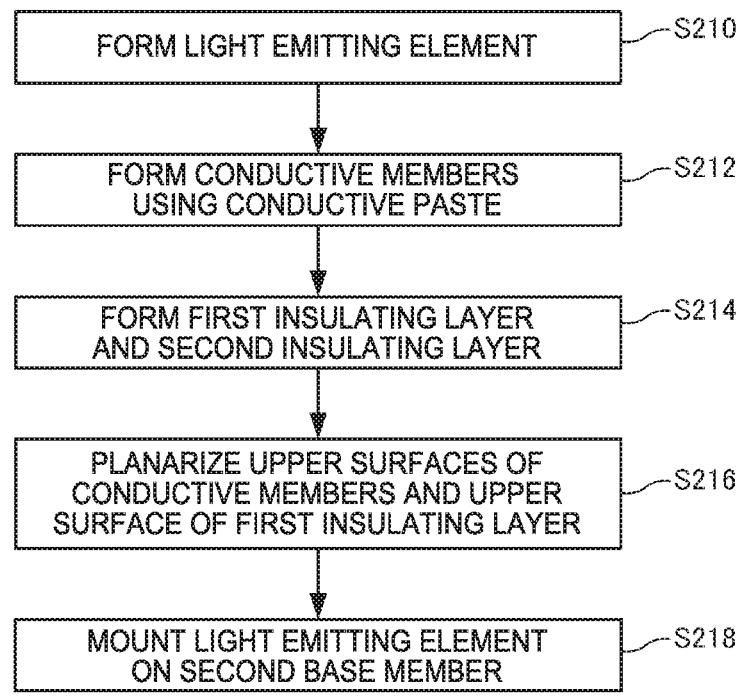
FIG. 12 is a flowchart showing a modified example of the method of manufacturing the light emitting device according to the second embodiment.
Figure 13:
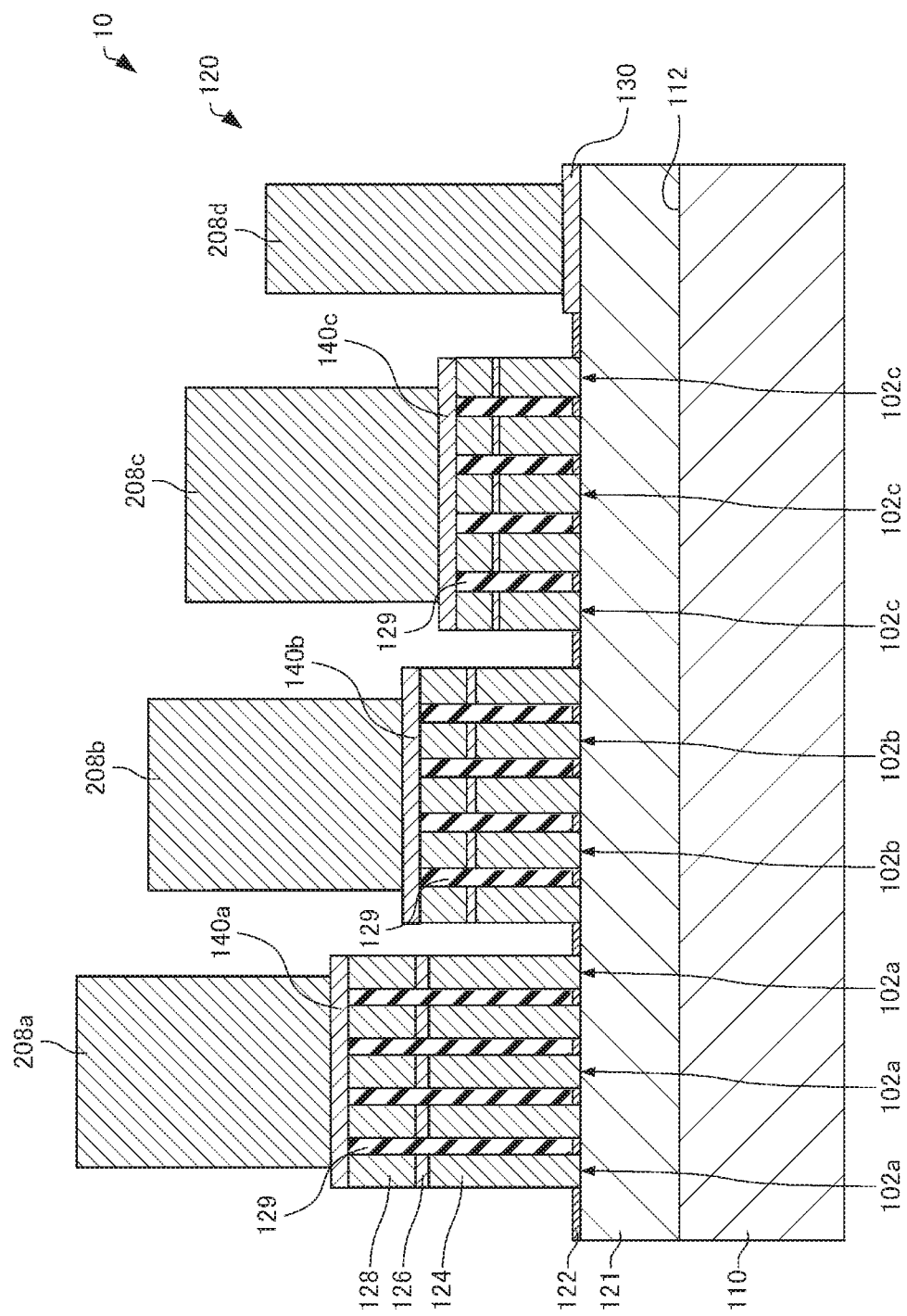
FIG. 13 is a cross-sectional view schematically showing a modified example of the manufacturing process of the light emitting device according to the second embodiment.
Figure 14:
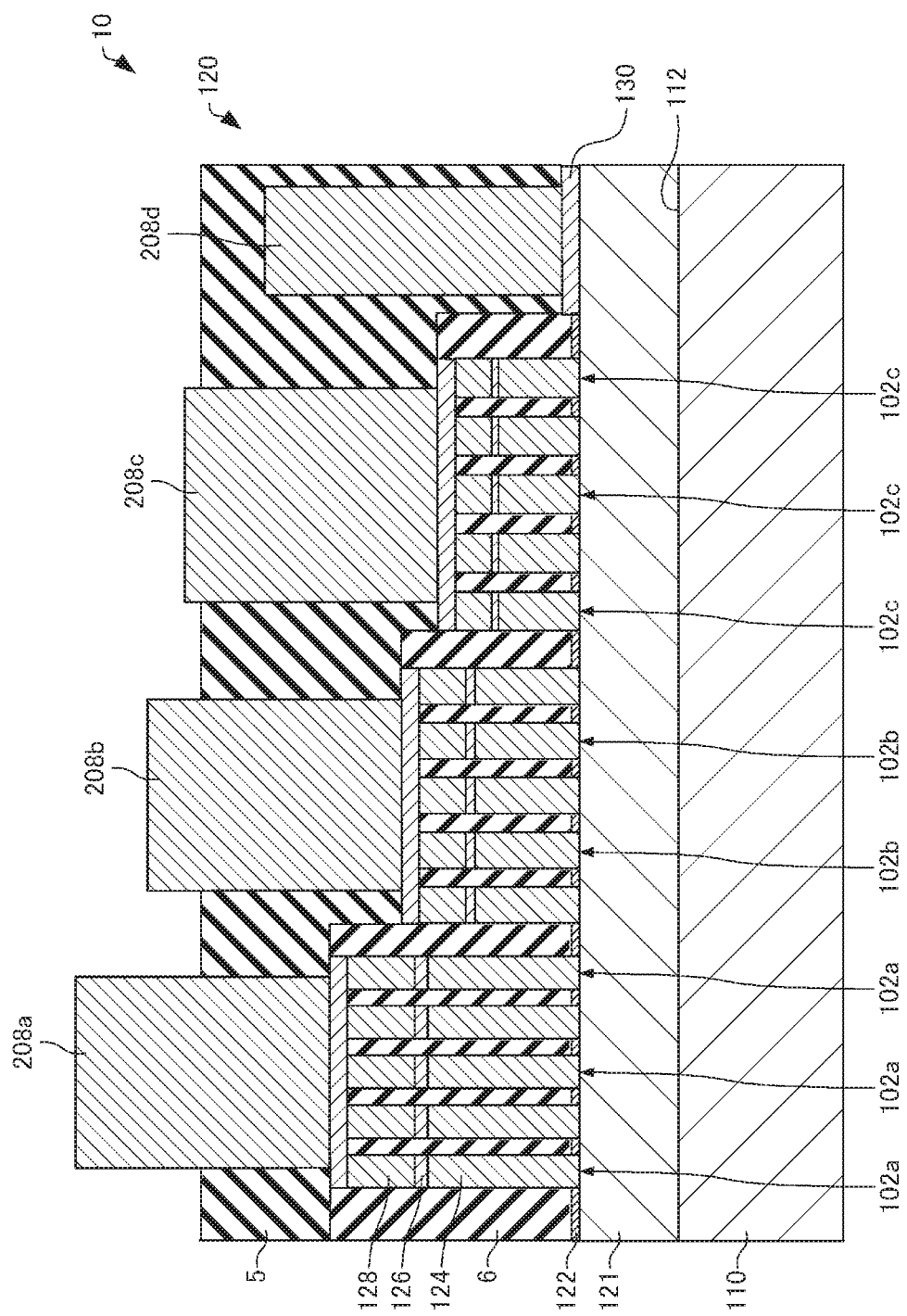
FIG. 14 is a cross-sectional view schematically showing the modified example of the manufacturing process of the light emitting device according to the second embodiment.

FIG. 12 is a flowchart showing the modified example of the method of manufacturing the light emitting device according to the second embodiment. FIG. 13 and FIG. 14 are cross-sectional views schematically showing the modified example of the manufacturing process of the light emitting device according to the second embodiment.

Firstly, as shown in FIG. 3, the light emitting element 10 is formed (S210).

The present process S210 is performed in substantially the same manner as the process S200 shown in FIG. 10 described above.

Then, as shown in FIG. 13, the conductive members 208a, 208b, 208c and 208d are formed using the conductive paste (S212).

Specifically, firstly, the conductive paste is formed on the second electrode 140a. Similarly, the conductive paste is formed on the second electrode 140b. Similarly, the conductive paste is formed on the second electrode 140c. Similarly, the conductive paste is formed on the first electrode 130. These conductive pastes are formed at the same time using, for example, the printing method. Then, the conductive pates are calcined. Thus, the conductive members 208a, 208b, 208c and 208d are formed.

Then, as shown in FIG. 14, the first insulating layer 5 and the second insulating layer 6 are formed (S214).

Specifically, the second insulating layer 6 is formed on the mask layer 122, and the first insulating layer 5 is formed on the second insulating layer 6. The first insulating layer 5 and the second insulating layer 6 are formed using, for example, the spin coat method, the ALD method, or the CVD method.

Then, as shown in FIG. 11, the upper surfaces of the conductive members 208a, 208b, 208c and 208d and the upper surface of the first insulating layer 5 are planarized by grinding or the cutting work (S216). Thus, the height $H_{208b}$ of the second conductive member 208b is made larger than the height $H_{208a}$ of the first conductive member 208a, and the height $H_{208c}$ of the third conductive member 208c is made larger than the height $H_{208b}$ of the second conductive member 208b.

Then, as shown in FIG. 9, the light emitting element 10 is mounted on the second base member 20 (S218).

The present process S218 is performed in substantially the same manner as the process S208 shown in FIG. 2 described above.

According to the process described hereinabove, the light emitting device 200 can be manufactured.

In the method of manufacturing the light emitting device according to the present modified example, it is possible to exert substantially the same functions and advantages as those of the method of manufacturing the light emitting device according to the second embodiment described above.

3. Third Embodiment

3.1. Light Emitting Device

Figure 15:
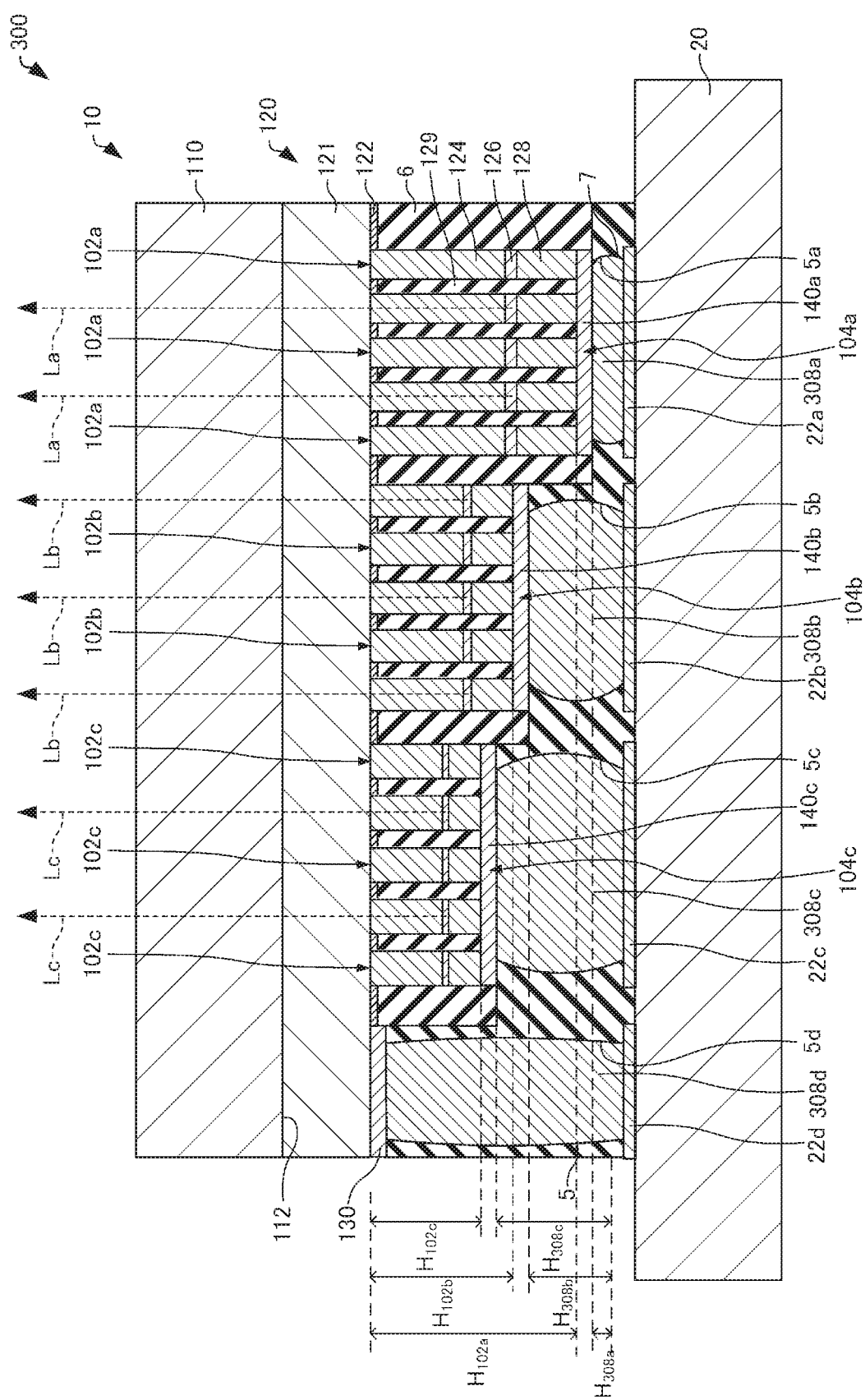
FIG. 15 is a cross-sectional view schematically showing a light emitting device according to a third embodiment of the invention.

Then, a light emitting device according to a third embodiment will be described with reference to the accompanying drawings. FIG. 15 is a cross-sectional view schematically showing the light emitting device 300 according to the third embodiment. Hereinafter, in the light emitting device 300 according to the third embodiment, the members having the same functions as those of the constituent members of the light emitting device 100 according to the first embodiment described above will be denoted by the same reference symbols, and detailed description thereof will be omitted.

In the light emitting device 100 described above, the conductive members 8a, 8b and 8c for electrically connecting the second electrodes 140a, 140b and 140c and the interconnections 22a, 22b and 22c of the second base member 20 to each other, and the conductive member 8d for electrically connecting the first electrode 130 and the interconnection 22d of the second base member 20 to each other are each the metal bump formed using the electrolytic plating method, the electroless plating method, or the like.

In contrast, in the light emitting device 300, the conductive members 308a, 308b and 308c for electrically connecting the second electrodes 140a, 140b and 140c and the interconnections 22a, 22b and 22c of the second base member to each other, and the conductive member 308d for electrically connecting the first electrode 130 and the interconnection 22d of the second base member 20 to each other are each a bump (e.g., a stud bump) to achieve electrical connection by pressing a metal ball. The material of the bump used as the conductive members 308a, 308b, 308c and 308d is metal such as gold.

The height $H_{308c}$ of the second conductive member 308b is larger than the height $H_{308a}$ of the first conductive member 308a. The height $H_{208c}$ of the third conductive member 308c is larger than the height $H_{308b}$ of the second conductive member 308b. In the example shown in the drawings, a sum of the height $H_{308a}$ of the first conductive member 308a and the height $H_{102a}$ of the first columnar sections 102a, a sum of the height $H_{308b}$ of the second conductive member 308b and the height $H_{102b}$ of the second columnar sections 102b, and a sum of the height $H_{308c}$ of the third conductive member 308c and the height $H_{102c}$ of the third columnar sections 102c are equal to each other. It should be noted that the heights $H_{308a}$, $H_{308b}$ and $H_{208c}$ are sizes in the stacking direction of the conductive members 308a, 308b and 308c, respectively.

In the light emitting device 300, it is possible to exert substantially the same functions and advantages as those of the light emitting device 100 described above.

3.2. Method of Manufacturing Light Emitting Device

Figure 16:
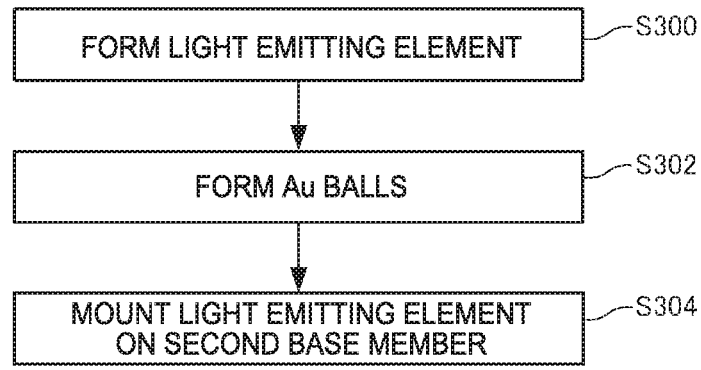
FIG. 16 is a flowchart showing an example of a method of manufacturing the light emitting device according to the third embodiment.
Figure 17:
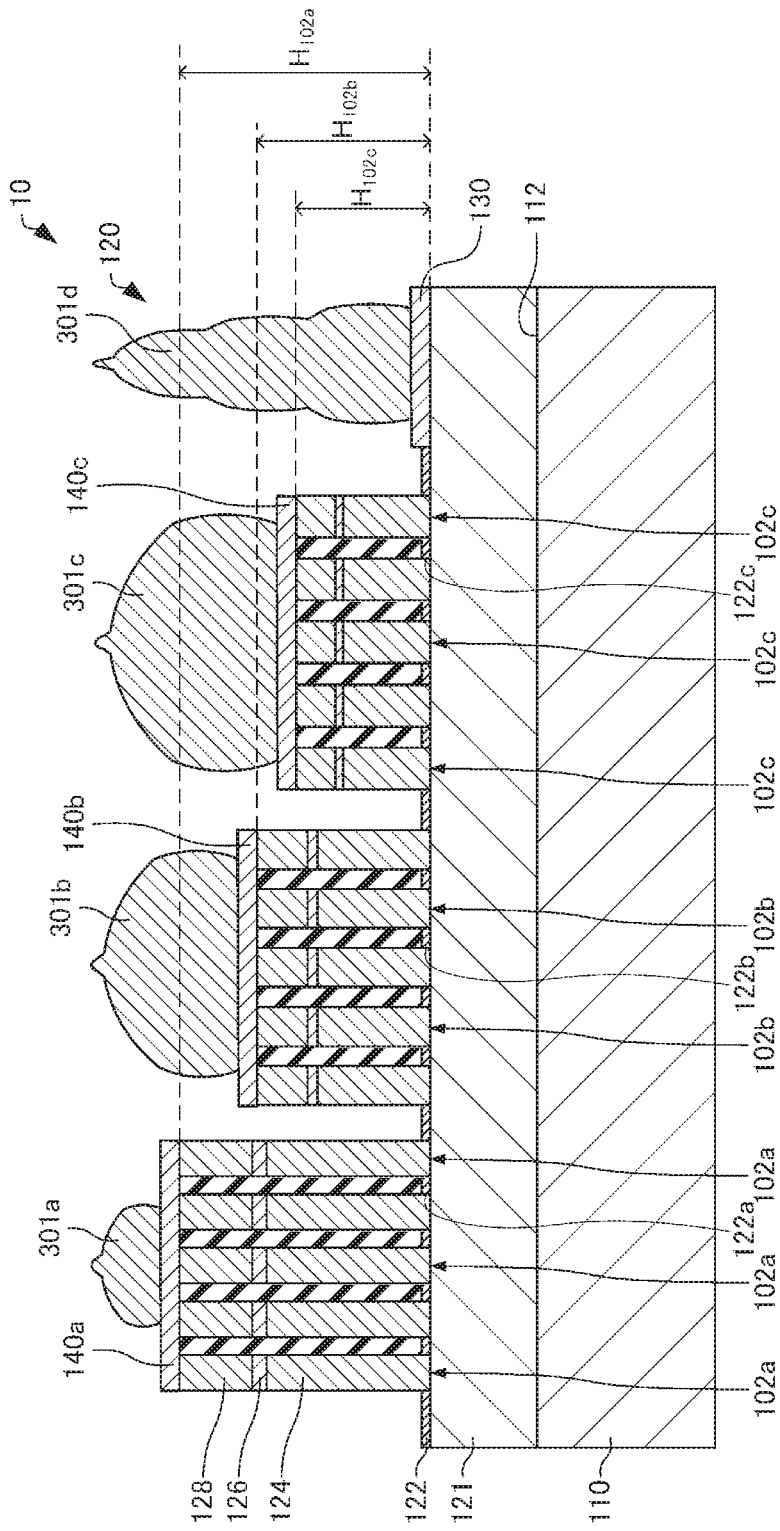
FIG. 17 is a cross-sectional view schematically showing a manufacturing process of the light emitting device according to the third embodiment of the invention.

Then, a method of manufacturing the light emitting device according to the third embodiment will be described with reference to the accompanying drawings. FIG. 16 is a flowchart showing an example of the method of manufacturing the light emitting device according to the third embodiment. FIG. 17 is a cross-sectional view schematically showing a manufacturing process of the light emitting device according to the third embodiment. Hereinafter, differences from the method of manufacturing the light emitting device according to the first embodiment shown in FIG. 2 described above will be explained, and the description of similarities will be omitted.

Firstly, as shown in FIG. 3, the light emitting element 10 is formed (S300).

The present process S300 is performed in substantially the same manner as the process S100 shown in FIG. 2 described above.

Then, as shown in FIG. 17, Au balls 301a, 301b, 301c and 301d are formed (S302).

Specifically, firstly, the Au ball 301a is formed on the second electrode 140a. Similarly, the Au ball 301b is formed on the second electrode 140b. Similarly, the Au ball 301c is formed on the second electrode 140c. Similarly, the Au ball 301d is formed on the first electrode 130. These Au balls 301a, 301b, 301c and 301d are formed using, for example, the technology of wire bonding.

On this occasion, the Au balls 301a, 301b and 301c are formed to have sizes corresponding to the heights $H_{102c}$, $H_{102b}$ and $H_{102c}$ of the columnar sections 102a, 102b and 102c, respectively. Specifically, in the light emitting element 10, since the height $H_{102a}$ of the first columnar sections 102a is larger than the height $H_{102b}$ of the second columnar sections 102b, the Au ball 301a is formed to be smaller than the Au ball 301b. Further, since the height $H_{102b}$ of the second columnar sections 102b is larger than the height $H_{102c}$ of the third columnar sections 102c, the Au ball 301b is formed to be smaller than the Au ball 301c. Thus, it is possible to reduce the possibility of occurrence of the contact failure.

Then, as shown in FIG. 15, the light emitting element 10 is mounted on the second base member 20 (S304).

Specifically, the light emitting element 10 is positioned on the second base member 20 so that the Au ball 301a is disposed on the interconnection 22a, the Au ball 301b is disposed on the interconnection 22b, the Au ball 301c is disposed on the interconnection 22c, and the Au ball 301d is disposed on the interconnection 22d. Then, the light emitting element 10 is pressed against the second base member 20 to apply pressure to the Au balls 301a, 301b, 301c and 301d, and at the same time, the Au balls 301a, 301b, 301c and 301d are heated (thermocompression bonding). Thus, the conductive members 308a, 308b, 308c and 308d are formed.

Then, the first insulating layer 5 and the second insulating layer 6 are formed. The first insulating layer 5 and the second insulating layer 6 are made of liquid curable resin (an underfill material) such as epoxy resin. By supplying the liquid curable resin between the stacked body 120 and the second base member 20 and then making the liquid curable resin cure, it is possible to form the first insulating layer 5 and the second insulating layer 6. In this case, the first insulating layer 5 and the second insulating layer 6 are formed integrally.

Due to the process described hereinabove, it is possible to mount the light emitting element 10 on the second base member 20 with the junction-down mounting.

It should be noted that it is also possible to form the second insulating layer 6 before the process S304 of mounting the light emitting element 10 on the second base member 20, and then, form the first insulating layer 5 in the process S304 of mounting the light emitting element 10 on the second base member 20.

According to the process described hereinabove, the light emitting device 300 can be manufactured.

4. Fourth Embodiment

Figure 18:
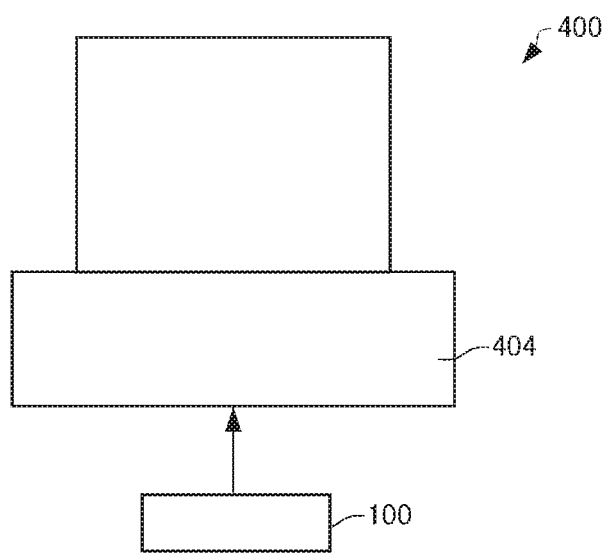
FIG. 18 is a diagram schematically showing a projector according to a fourth embodiment of the invention.

Then, a projector according to a fourth embodiment will be described with reference to the accompanying drawings. FIG. 18 is a diagram schematically showing the projector 400 according to the fourth embodiment. It should be noted that in FIG. 18, a housing for constituting the projector 400 is omitted from the illustration for the sake of convenience.

The projector 400 includes a light emitting device according to the invention. Hereinafter, the projector 400 including the light emitting device 100 will be described as shown in FIG. 18.

As shown in FIG. 18, the projector 400 includes the light emitting device 100 and a projection lens 404.

The light emitting device 100 has a plurality of first light emitting sections 104*a* for emitting the blue light La, a plurality of second light emitting sections 104*b* for emitting the green light Lb, a plurality of third light emitting sections 104*c* for emitting the red light Lc. The plurality of first light emitting sections 104*a*, the plurality of second light emitting sections 104*b*, and the plurality of third light emitting sections 104*c* are disposed on the same base member (the first base member 110).

The light emitting device 100 uses the plurality of first light emitting sections 104*a*, the plurality of second light emitting sections 104*b* and the plurality of third light emitting sections 104*c* as the pixels of the picture, and the plurality of first light emitting sections 104*a*, the plurality of second light emitting sections 104*b* and the plurality of third light emitting sections 104*c* are controlled in accordance with the image information. Thus, in the projector 400, it is possible to directly form the picture without using, for example, liquid crystal light valves (light modulation devices).

The projection lens 404 enlarges the picture formed by the light emitting device 100, and then projects the picture on the screen (a display surface) not shown.

In the projector 400, the light emitted from the light emitting device 100 directly enters the projection lens 404, and the picture formed by the light emitting device 100 is displayed on the screen (the display surface) in an enlarged manner. As described above, in the projector 400, it is possible to perform full-color image display with a single light emitting device 100.

In the projector 400, there is included the light emitting device 100. Therefore, in the projector 400, it is possible to directly form the picture without using, for example, liquid crystal light valves (light modulation devices). Therefore, in the projector 400, it is possible to reduce the transmission loss (failure in transmission of apart of the light through the liquid crystal light valves) in the liquid crystal light valves to thereby achieve an increase in luminance. Further, in the projector 400, the number of components can be reduced, and thus, it is possible to achieve the cost reduction.

The purpose of the light emitting device according to the invention is not limited to the embodiments described above, but the light emitting device can also be used as an indoor/outdoor illumination, a backlight for a display, and a light source of a laser printer, a scanner, an in-car light, sensing equipment using light, communication equipment, and so on besides the projector.

The invention can be implemented with some of the constituents omitted, or any of the embodiments and the modified examples combined with each other as long as the features and the advantages described in the specification are provided.

The invention includes configurations (e.g., configurations having the same function, the same way, and the same result, or configurations having the same object and the same advantage) substantially the same as the configuration described as the embodiments of the invention. Further, the invention includes configurations obtained by replacing a non-essential part of the configuration described as the embodiments of the invention. Further, the invention includes configurations providing the same functions and advantages and configurations capable of achieving the same object as the configuration described as the embodiments of the invention. Further, the invention includes configurations obtained by adding known technologies to the configuration described as one of the embodiments of the invention.

The entire disclosure of Japanese Patent Application No. 2017-248943, filed on Dec. 26, 2017 is expressly incorporated by reference herein.

What is claimed is:
1. A light emitting device, comprising:
a light emitting element including a first base member, and a stacked body provided to the first base member, the first base member being plate-shaped, the first base member having a light-transmission optical property, a light emitted from the stacked body passing through the first base member; and
a second base member on which the light emitting element is mounted,
wherein the stacked body is located between the first base member and the second base member,
the stacked body includes
a first columnar section having a first height along a first direction, and
a second columnar section having a second height along the first direction, and the second height is smaller than the first height,
the first columnar section and the second columnar section each include
a first semiconductor layer,
a second semiconductor layer different in conductivity type from the first semiconductor layer, and
a light emitting layer disposed between the first semiconductor layer and the second semiconductor layer, the light emitting layer being configured to emit the light in response to a current injected into the light emitting layer,
the first columnar section and the second base member are electrically connected to each other via a first conduc- tive member, and the first conductive member is located between the stacked body and the second base member, the second columnar section and the second base member are electrically connected to each other via a second conductive member, and the second conductive member is located between the stacked body and the second base member, the first conductive member has a third height along the first direction, the second conductive member has a fourth height along the first direction, and the fourth height is larger than the third height, and a side wall along the first direction of the first columnar section abuts a side wall along the first direction of the second columnar section via a first insulating layer.

2. The light emitting device according to claim 1, wherein a second insulating layer is disposed between the first base member and the second base member, the first conductive member is disposed in a first opening provided in the second insulating layer, and the second conductive member is disposed in a second opening provided in the second insulating layer.

3. The light emitting device according to claim 1, wherein a wavelength of the light emitted by the light emitting layer in the first columnar section and a wavelength of the light emitted by the light emitting layer in the second columnar section are different from each other.

4. A projector, comprising:
a light emitting device, the light emitting device including:
  a light emitting element including a first base member, and a stacked body provided to the first base member, the first base member being plate-shaped, the first base member having a light-transmission optical property, a light emitted from the stacked body passing through the first base member; and
  a second base member on which the light emitting element is mounted; and
a projection lens through which the light emitted from the light emitting device passes,
wherein the stacked body is located between the first base member and the second base member,
the stacked body includes:
  a first columnar section having a first height along a first direction; and
  a second columnar section having a second height along the first direction, and the second height is smaller than the first height,
the first columnar section and the second columnar section each include:
  a first semiconductor layer;
  a second semiconductor layer different in conductivity type from the first semiconductor layer; and
  a light emitting layer disposed between the first semiconductor layer and the second semiconductor layer, the light emitting layer being configured to emit the light in response to a current injected into the light emitting layer,
the first columnar section and the second base member are electrically connected to each other via a first conductive member, and the first conductive member is located between the stacked body and the second base member,
the second columnar section and the second base member are electrically connected to each other via a second conductive member, and the second conductive member is located between the stacked body and the second base member,
the first conductive member has a third height along the first direction,
the second conductive member has a fourth height along the first direction, and the fourth height is larger than the third height, and
a side wall along the first direction of the first columnar section abuts a side wall along the first direction of the second columnar section via a first insulating layer.

5. A The projector according to claim 4,
wherein a second insulating layer is disposed between the first base member and the second base member,
the first conductive member is disposed in a first opening provided in the second insulating layer, and
the second conductive member is disposed in a second opening provided in the second insulating layer.

6. The projector according to claim 4,
wherein a wavelength of the light emitted by the light emitting layer in the first columnar section and a wavelength of the light emitted by the light emitting layer in the second columnar section are different from each other.

* * * * *